United States Patent
Palmer

(10) Patent No.: US 10,840,103 B2
(45) Date of Patent: Nov. 17, 2020

(54) FORCED GRID METHOD FOR CORRECTING MASK PATTERNS FOR A PATTERN TRANSFER APPARATUS

(71) Applicant: NIKON CORPORATION, Tokyo (JP)

(72) Inventor: Shane R. Palmer, Oro Valley, CA (US)

(73) Assignee: NIKON CORPORATION (JP)

( * ) Notice: Subject to any disclaimer, the term of this patent is extended or adjusted under 35 U.S.C. 154(b) by 0 days.

(21) Appl. No.: 15/359,312

(22) Filed: Nov. 22, 2016

(65) Prior Publication Data
US 2017/0146900 A1 May 25, 2017

Related U.S. Application Data

(60) Provisional application No. 62/258,963, filed on Nov. 23, 2015.

(51) Int. Cl.
| | |
|---|---|
| *G03B 27/42* | (2006.01) |
| *H01L 21/308* | (2006.01) |
| *G03F 7/16* | (2006.01) |
| *G03F 7/20* | (2006.01) |
| *G03F 7/34* | (2006.01) |
| *G03F 7/30* | (2006.01) |

(52) U.S. Cl.
CPC .......... *H01L 21/3086* (2013.01); *G03F 7/16* (2013.01); *G03F 7/20* (2013.01); *G03F 7/30* (2013.01); *G03F 7/34* (2013.01); *G03F 7/70291* (2013.01); *G03F 7/70508* (2013.01)

(58) Field of Classification Search
CPC .......... G03F 7/70291; G03F 7/70508; G03F 7/2051; G03F 7/20; G03F 7/70058; G03F 7/70116; G03F 7/702; G03F 7/70391; G03F 7/70; G03F 7/70558; G03F 7/70625; G03F 7/70283; G03F 7/70258; G03F 1/26; G03F 7/70216
See application file for complete search history.

(56) References Cited

U.S. PATENT DOCUMENTS

| | | | |
|---|---|---|---|
| 8,089,616 B2 | 1/2012 | Owa | |
| 8,405,816 B2 | 3/2013 | Hirukawa et al. | |
| 8,792,081 B2 | 7/2014 | Owa | |
| 2005/0153246 A1* | 7/2005 | Eib | G03F 7/70291 430/313 |
| 2009/0135399 A1* | 5/2009 | Hirukawa | G03F 7/70283 355/71 |
| 2013/0222781 A1 | 8/2013 | Watanabe | |
| 2013/0278912 A1 | 10/2013 | Owa et al. | |
| 2013/0314683 A1 | 11/2013 | Watanabe et al. | |
| 2015/0227075 A1 | 8/2015 | Palmer | |
| 2015/0234295 A1 | 8/2015 | Palmer et al. | |

* cited by examiner

*Primary Examiner* — Mesfin T Asfaw
(74) *Attorney, Agent, or Firm* — Roeder & Broder LLP; Steven G. Roeder

(57) ABSTRACT

A method for transferring an actual workpiece pattern (23) to a workpiece (24) using a pixelated phase mask (14) includes (i) evaluating a desired workpiece pattern (226) to identify a desired repetitive step cell (230) in the desired workpiece pattern (226), the desired repetitive step cell (230) having a desired step cell width (250), and a desired step cell length (252); (ii) evaluating if the desired step cell width (250) is equal to a first integer multiplied by a pixel width (28A) and an optical adjustment factor; and (iii) evaluating if the desired step cell length (252) is equal to a second integer multiplied by a pixel length (28B) and an optical adjustment factor.

66 Claims, 10 Drawing Sheets

FORCED GRID METHOD FOR CORRECTING MASK PATTERNS FOR A PATTERN TRANSFER APPARATUS

CROSS-REFERENCE TO RELATED APPLICATION

This application claims priority on U.S. Provisional Application Ser. No. 62/258,963 filed on Nov. 23, 2015 and entitled "FORCED GRID METHOD FOR CORRECTING MASK PATTERNS FOR A PATTERN TRANSFER APPARATUS". As far as is permitted, the contents of U.S. Provisional Application Ser. No. 62/258,963 is incorporated herein by reference.

BACKGROUND

A digital pattern transfer apparatus can be used to create a pattern of fine features on a semiconductor wafer using a pixelated phase mask. Unfortunately, the size of the pixels in the phase mask sometimes does not correspond well to the pattern of fine features desired to be transferred.

SUMMARY

The present invention is directed to a method for transferring an actual workpiece pattern to a workpiece using a phase mask that includes a plurality of pixels. Each pixel has a pixel width measured along a first axis and a pixel length measured along a second axis. The method includes (i) evaluating a desired workpiece pattern to identify a desired repetitive step cell in the desired workpiece pattern, the desired repetitive step cell having a desired step cell width measured along the first axis and a desired step cell length measured along the second axis; (ii) evaluating if the desired step cell width is equal to a first integer multiplied by the pixel width; and (iii) evaluating if the desired step cell length is equal to a second integer multiplied by the pixel length.

In one embodiment, the method includes creating an adjusted repetitive step cell from the desired repetitive step cell; the adjusted repetitive step cell having an adjusted step cell width and an adjusted step cell length. In certain embodiments, the adjusted step cell width is equal to the first integer multiplied by the pixel width, and the adjusted step cell length is equal to the second integer multiplied by the pixel length. The adjusted repetitive step cell can be created by scaling the desired repetitive step cell. Additionally, the adjusted repetitive step cell can be used to create a mask stepping array for the phase mask.

In certain embodiments, the first integer is a multiple of two and/or the second integer is a multiple of two.

Additionally, the method can include providing the phase mask, controlling a phase of each of the pixels with a control system including a processor, and directing a shaped illumination beam at the phase mask.

As provided herein, the desired workpiece pattern can include a single repetitive pattern or multiple repetitive patterns positioned adjacent to each other.

In another embodiment, the method includes (i) evaluating a desired workpiece pattern with a control system that includes a processor to identify a desired repetitive step cell in the desired workpiece pattern, the desired repetitive step cell having a desired step cell width, and a desired step cell length; (ii) evaluating with the control system if the desired step cell width is equal to a first integer multiplied by the pixel width; (iii) evaluating with the control system if the desired step cell length is equal to a second integer multiplied by the pixel length; and (iv) creating an adjusted repetitive step cell from the desired repetitive step cell with the control system; the adjusted repetitive step cell having an adjusted step cell width and an adjusted step cell length; wherein the adjusted step cell width is equal to the first integer multiplied by the pixel width, and the adjusted step cell length is equal to the second integer multiplied by the pixel length.

In yet another embodiment, the present invention is directed to a device for manufacturing a workpiece. In this embodiment, the device includes: (i) a spatial light modulator having plurality of pixels; (ii) an illumination system that directs radiation at the spatial light modulator; and (iii) a projection optical system that directs the radiation at the workpiece to transfer a circuit pattern at the workpiece, the projection optical system having an optical adjustment factor. The circuit pattern includes a plurality of regions having the same pattern. Further, a first region dimension of each region measured along a first direction is equal to a first integer multiplied by a first value, wherein, the first value is a first pixel dimension of the pixel measured along a second direction multiplied by the optical adjustment factor.

Further, a second region dimension of each region measured along a third direction crossing to the first direction is equal to a second integer multiplied by a second value, wherein, the second value is a second pixel dimension of the pixel measured along a fourth direction multiplied by the optical adjustment factor.

In certain embodiments, the plurality of pixels of the spatial light modulator change a phase of the emitted radiation. The plurality of regions can be arranged along the first and third direction. Further, the plurality of regions can be rectangular shaped. Moreover, the plurality of regions can be arranged as a two-dimensional array.

In one embodiment, the first integer is a multiple of two and the second integer is a multiple of two. Further, the plurality of regions are arranged along the first direction. Moreover, the plurality of regions are adjacent to each other. Additionally, the first integer can be a multiple of two.

In another embodiment, the present invention is directed to an exposure method that exposes a workpiece by using a spatial light modulator having a plurality of pixels. The method can include (i) irradiating the spatial light modulator with radiation; (ii) allowing the radiation form the spatial light modulator to come into a projection optical system, the projection optical system having an optical adjustment factor; and (iii) exposing a plurality of regions on the workpiece by using radiation from the projection optical system. In this embodiment, the plurality of regions have the same pattern, and a first region dimension of each region measured along a first direction is equal to a first integer multiplied by a first value, wherein the first value is a first pixel dimension of the pixel measured along a second direction, multiplied by the optical adjustment factor.

The present invention can also include preparing drive data of the plurality of pixels of the spatial light modulator. The step of preparing can include converting pattern data of exposing pattern to the drive data. Moreover, the converting can include: identifying a repetitive pattern region in the exposing pattern; and evaluating a second pattern dimension, measured along the second direction, of the repetitive pattern region to determine if the second pattern dimension is equal to the first integer multiplied by (i) a second pixel dimension of the pixel along the second direction and (ii) the optical adjustment factor.

As provided herein, the converting can include scaling the repetitive pattern region when the second region dimension of the repetitive pattern region along the second direction is not equal to the first integer multiplied by (i) the second pixel dimension of the pixel along the second direction and (ii) the optical adjustment factor.

Moreover, the invention can include changing an optical adjustment factor of the projection optical system when the second region dimension of the repetitive pattern region along the second direction is not equal to the first integer multiplied by (i) the second pixel dimension of the pixel along the second direction and (ii) the optical adjustment factor.

The exposing can include exposing the plurality of regions on the workpiece; and exposing a region on the workpiece other than the plurality of regions. Further, the changing can include changing the optical adjustment factor of the projection optical system between exposing the plurality of regions and exposing another region other than the plurality of regions.

In yet another embodiment, the present invention is directed to a method for producing a device, comprising; exposing a photosensitive substrate with a predetermined pattern; developing the photosensitive substrate to which the predetermined pattern is transferred so that a mask layer, which has a shape corresponding to the predetermined pattern, is formed on a surface of the photosensitive substrate; and processing the surface of the photosensitive substrate via the mask layer.

In still another embodiment, the present invention is directed to an exposure apparatus for exposing a workpiece. The exposure apparatus can include: a spatial light modulator including a plurality of pixels; an illumination system that directs radiation at the spatial light modulator; a projection optical system directs the radiation from the spatial light modulator along an optical axis, the projection optical system having an optical adjustment factor; a stage which holds the workpiece, the stage being movable in a plane crossing to the optical axis of the projection optical system; and a controller which controls at least the spatial light modulator and the stage to expose a plurality of regions on the workpiece using radiation from the projection optical system. The plurality of regions have the same pattern, and a first region dimension of each region measured along a first direction equal to a first integer multiplied by a first value, wherein the first value is a first pixel dimension of the pixel measured along a second direction, multiplied by the optical adjustment factor of the projection optical system.

DESCRIPTION

Figure 1A:
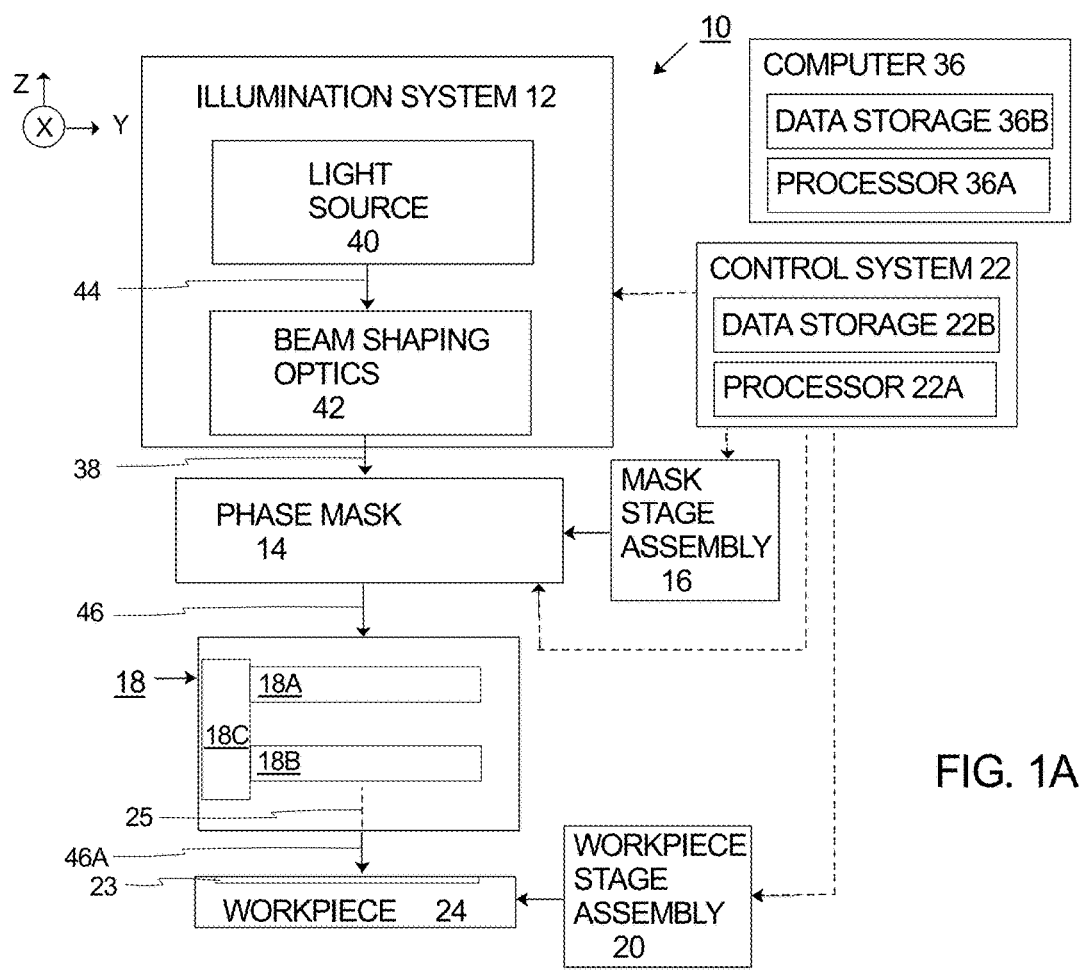
FIG. 1A is a simplified block diagram of a pattern transfer apparatus that transfers an actual workpiece pattern to a workpiece.

FIG. 1A is a simplified schematic view illustrating a pattern transfer apparatus 10 that includes an illumination system 12, a programmable phase mask 14, a mask stage assembly 16, a projection optical assembly 18, a workpiece stage assembly 20, and a control system 22. The pattern transfer apparatus 10 is particularly useful as a digital scanner that generates an actual workpiece pattern 23 (illustrated as a box) on a workpiece 24. For example, the workpiece 24 can be a sensitized substrate such as a semiconductor wafer or other material to which a photosensitive layer has been applied for use in photo-patterning.

The design of each of the components of the pattern transfer apparatus 10 can be varied to suit the design requirements of the stage assembly 10. Further, one or more of the components of the pattern transfer apparatus 10 can be optional. For example, the pattern transfer apparatus 10 can be designed without the mask stage assembly 16.

Some of the Figures provided herein include an orientation system that designates the X axis, the Y axis, and a Z axis that are orthogonal to each other. In these Figures, the Z axis is oriented in the vertical direction. It should be understood that the orientation system is merely for reference and can be varied. For example, the X axis can be switched with the Y axis. Moreover, these axes can alternatively be referred to as the first, the second, or a third axis.

As an overview, in certain embodiments, the present invention is directed to a forced grid method for correcting a mask pattern 425 (illustrated in FIG. 4A) that is generated by the phase mask 14. Typically, a desired workpiece pattern 226 (illustrated in FIG. 2A) is designed by a circuit pattern designer. The desired workpiece pattern 226 is the pattern of features that the circuit pattern designer wishes to create on the workpiece 24 with the pattern transfer apparatus 10.

Unfortunately, the desired workpiece pattern 226 may not correspond exactly to the size of the pixels 28 (illustrated in FIG. 1B) of the phase mask 14.

In one embodiment, the force grid method provided herein evaluates the desired workpiece pattern 226 to identify a desired repetitive step cell 230 (illustrated in FIG. 2A) in the desired workpiece pattern 226. Subsequently, the present invention can adjust the size of the desired repetitive step cell 230 (if necessary) to create an adjusted repetitive step cell 232 (illustrated in FIG. 2D) that better corresponds to the size of the pixels 28. Subsequently, the adjusted repetitive step cell 232 can be used to create a mask stepping array 434 (illustrated in FIG. 4B) that is matched to the size of the pixel 28 used in the phase mask 14. The mask stepping array 434 can be repeated to create the mask pattern 425 used to control the phase mask 14. This greatly simplifies the pixel correction for the mask pattern 425, greatly reduces the correction times for large mask patterns 425, and minimizes the amount of data required to be stored for the mask pattern 425. Further, as a result of this design, the mask pattern 425 is matched to the size of the pixel 28 used in the phase mask 14. This allows for the quick proximity correction using a symmetric pixel correction array that dramatically reduces correction times for large pattern arrays Additionally, it should be noted that one or more of the methods provided herein can be performed by one or more external computers 36 (only one is illustrated in FIG. 1A as a box).

The external computer 36 can include one or more processors 36A and electronic data storage 36B, and can be programmed to perform one or more of the steps of the method provided herein. For example, the external computer(s) 36 can be programmed to perform one or more of the steps of (i) generating the desired workpiece pattern 226; (ii) evaluating the desired workpiece pattern 226 to identify one or more desired repetitive step cells 230; (iii) adjusting the size of the desired repetitive step cell 230 (if necessary) to create an adjusted repetitive step cell 232 that better corresponds to the size of the pixels 28; (iv) creating a mask stepping array 434 from the adjusted repetitive step cell 232; and/or (v) creating the mask pattern 425 using the mask stepping array 434.

The illumination system 12 generates a shaped illumination beam or set of shaped illumination beams 38 (radiation) that are directed at the digital phase mask 14. Stated in another fashion, the illumination system 12 directs the radiation 38 at the spatial light modulator, i.e. the digital phase mask 14. In one embodiment, the illumination system 12 includes a light source 40 and a beam shaping optics 42. In this embodiment, the light source 40 generates an illumination beam or set of illumination beams 44 that is shaped by the beam shaping optics 42 to generate the shaped illumination beam or set of shaped illumination beams 38. As a non-exclusive example, the light source 40 can be a laser that is controlled (e.g. pulsed) by the control system 22 to emit a substantially coherent illumination beam or set of illumination beams 44 have a center wavelength of between approximately 190 nanometers and 200 nanometers. For example, the light source 40 can be a pulsed light emitting diode which emits the pulsed illumination beam 44, or a solid-state pulsed laser light source which generates a harmonic of laser light output from a YAG laser or a solid-state laser (semiconductor laser or the like). As a specific example, the light source 40 can be a solid-state pulsed laser light source that emits pulses of laser light, e.g., at a wavelength of 193 nm (or anyone of various wavelengths) with the pulse widths of about one nanosecond, at a frequency of approximately 0.1 MHz to two MHz.

The beam shaping optics guides, conditions, and directs the shaped illumination beams 38 at the digital phase mask 16. The shaped illumination beam 38 illuminates the digital phase mask 14 and exposes the workpiece 24.

Figure 1B:
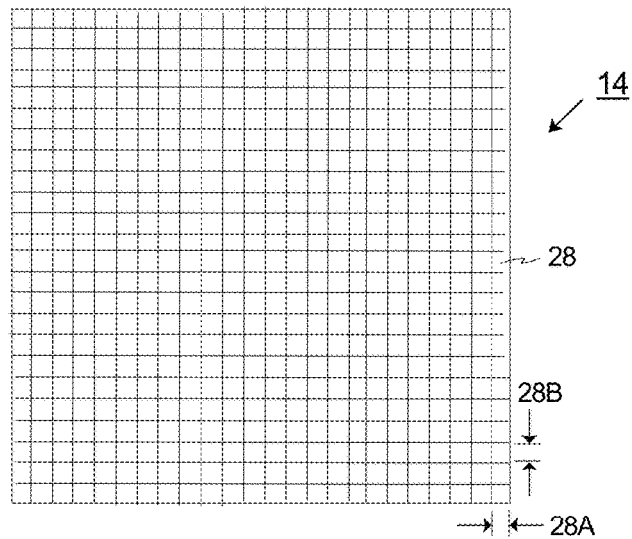
FIG. 1B is a simplified top view of a phase mask for the pattern transfer apparatus of FIG. 1A.
Figure 1C:
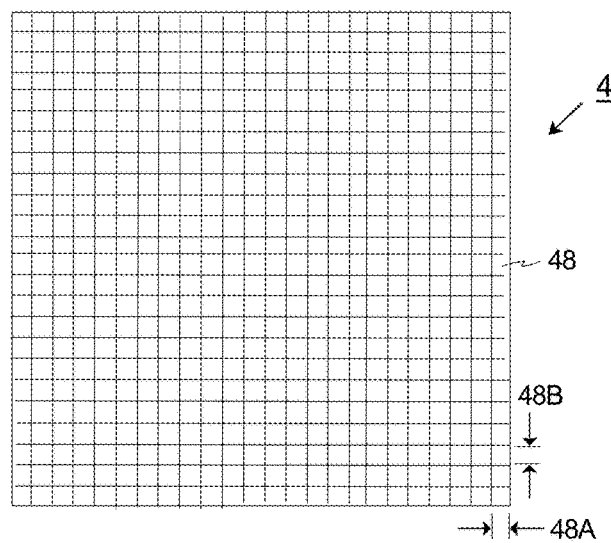
FIG. 1C is a simplified top view of an effective phase mask for the pattern transfer apparatus of FIG. 1A.

The programmable phase mask 14 receives the shaped illumination beams 38 and creates a pattern beam 46 that is directed at the workpiece 24 via the projection optical assembly 18 along an optical axis 25. FIG. 1B is a greatly simplified, non-exclusive example of the phase mask 14 that includes the plurality of pixels 28 that are arranged in a two dimensional, rectangular shaped, pixel array. The number, size, and shape of the pixels 28 in the phase mask 14 can be varied to achieve the design requirements of the phase mask 14. In the simplified example illustrated in FIG. 1B, the phase mask 14 includes a twenty-four by twenty-four array of pixels 28. However, a typical phase mask 14 can include thousands or millions of individually controlled pixels 28.

The programmable phase mask 14 can also be referred to as a spatial light modulator.

In FIG. 1B, each pixel 28 has a pixel width 28A measured along a direction, e.g. the first ("X") axis, and a pixel length 28B measured along a different direction, e.g. the second ("Y") axis. Further, in FIG. 1B, each pixel 28 is generally square shaped, with the pixel width 28A being equal to the pixel length 28B. As alternative, non-exclusive examples, each of the pixels 28 can have a pixel width 28A and a pixel length 28B of six, eight, ten, eleven, twelve, fourteen, sixteen, or twenty nanometers. However, other sizes are possible.

It should be noted that (i) the pixel width 28A can also be referred to a pixel dimension measured along a direction; and/or (i) the pixel length 28B can also be referred to a pixel dimension measured along a direction. Either of the pixel dimensions can be referred to as a first pixel dimension, or a second pixel dimension. For example, the pixel 28 can be referred to as having a first pixel dimension of the pixel measured along a first direction and a second pixel dimension of the pixel measured along a second direction.

In one embodiment, the control system 22 independently and individually controls a phase of each pixel 28 between a first phase (referred to as "Zero phase" or "0 phase"), and second phase (referred to as "Pi phase" or "π phase") to create the mask pattern 425 on the phase mask 14. In this design, the phase mask 14 is a digital phase mask. Alternatively, the phase mask 14 could be designed to have more than two phase assignments.

The mask stage assembly 16 can be controlled by the control system 22 to move and position the digital phase mask 14 along and/or about one or more axes to properly position the digital phase mask 14 relative to the workpiece 24. For example, the mask stage assembly 18 can include one or more planar motors, linear motors, voice coil motors, attraction only actuators, and/or other types of actuators. In certain embodiments, the position of the phase mask 14 is maintained stationary during the transfer of the workpiece pattern 23 to the workpiece 24.

The projection optical assembly 18 guides the pattern beam 46 from the phase mask 14 to the workpiece 24. Stated in another fashion, the projection optical assembly 18 projects and/or focuses the light passing through the programmable digital phase mask 14 at the workpiece 24. As provided herein, the projection optical assembly 18 has an optical adjustment factor that represents how the projection optical assembly 18 influences the size of the image transferred to the workpiece 24. For example, the projection optical assembly 18 can magnify or reduce (demagnify) the image illuminated on the workpiece 24. It could also be a 1× magnification system. For example, (i) for an optical adjustment factor of 1, the projection optical assembly 18 does not magnify or reduce the size of the image transferred to the workpiece; (ii) for an optical adjustment factor of 0.5, the projection optical assembly 18 reduces the size of the image transferred to the workpiece by one half; and (iii) for an optical adjustment factor of 1/200, the projection optical assembly 18 demagnifies the size of the image transferred to the workpiece by two hundred. As alternative, non-exclusive examples, projection optical assembly 18 can be designed to have an optical adjustment factor of approximately 0.003 (1/300); 0.004 (1/250); 0.005 (1/200); 0.006 (1/150); 0.025 (1/40); 0.01 (1/100); 0.02 (1/50); 0.04 (1/25); or 0.1 (1/10).

In certain embodiments, the magnification or reduction of the projection optical assembly 18 can be adjustable so that the dimension of the desired repetitive step cell can be scaled. In one, simplified example, the projection optical assembly 18 includes a first optical element 18A, a second optical element 18B that is spaced apart from the first optical element 18A along the optical axis 25, and an element mover 18C that moves at least one of the optical elements 18A, 18B relative to the other optical element 18B, 18A to selectively adjust the optical adjustment factor of the projection optical assembly 18. For example, the element mover 18C can move one or both of the optical elements 18A, 18B to adjust the optical adjustment factor between approximately 0.2 and 5. Stated in another fashion, in alternative, non-exclusive embodiments, the element mover 18C can move one or both of the optical elements 18A, 18B to adjust the optical adjustment factor to be approximately 0.003 (1/300); 0.004 (1/250); 0.005 (1/200); 0.006 (1/150); 0.025 (1/40); 0.01 (1/100); 0.02 (1/50); 0.04 (1/25); or 0.1 (1/10). With this design, the optical adjustment factor can be adjusted to adjust the size of the desired repetitive step cell 230 (if necessary) to create an adjusted repetitive step cell 232 (illustrated in FIG. 2D).

In certain embodiments, the optical adjustment factor is adjusted only a few percent in order to match the field that is being printed.

As a result of the projection optical assembly 18, the programmable phase mask 14 creates an adjusted pattern beam 46A that is directed at the workpiece 24 along the optical axis 25. Stated in a different fashion, each pixel 28 of the programmable phase mask 14 has an effective pixel size at the workpiece as a result of the optical adjustment factor of the projection optical assembly 18.

FIG. 10 is a greatly simplified, non-exclusive example of an effective phase mask 47 (as would be projected onto the workpiece) that includes the plurality of effective pixels 48 that are arranged in a two dimensional, rectangular shaped, pixel array. In FIG. 10, each effective pixel 48 has an effective pixel width 48A measured along a direction, e.g. the first ("X") axis, and an effective pixel length 48B measured along a different direction, e.g. the second ("Y") axis. As provided herein (i) the effective pixel width 48A is equal to the pixel width 28A (illustrated in FIG. 1B) multiplied by the optical adjustment factor; and (ii) the effective pixel length 48B is equal to the pixel length 28B (illustrated in FIG. 1B) multiplied by the optical adjustment factor. For example, with reference to FIGS. 1B and 10, if the pixel 28 has a pixel width 28A of two microns and a pixel length 28B of two microns, and the optical adjustment factor is 0.005 (1/200) microns, then the effective pixel 48 has an effective pixel width 48A of ten nanometers, and an effective pixel length 48B of ten nanometers.

In certain embodiments, larger demagnification values are used for the projection optical assembly 18 to ease the restraints on the scale of the programmable digital phase mask 14 and allow it to be larger and easier to build. However, one issue with using a large demagnification is that the field (effective phase mask 47 at the workpiece 24) is reduced (correspondingly) in size which creates smaller exposure area (hence longer write times to do the same area).

It should be noted that (i) the effective pixel width 48A can also be referred to an effective pixel dimension measured along a direction; and/or (i) the effective pixel length 48B can also be referred to an effective pixel dimension measured along a direction. Either of the effective pixel dimensions can be referred to as a first effective pixel dimension, or a second effective pixel dimension. For example, the effective pixel 48 can be referred to as having a first effective pixel dimension of the pixel measured along a first direction and a second effective pixel dimension of the pixel measured along a second direction. As used herein, the effective pixel width 48A can also referred to as a first value and the effective pixel length 48B is also be referred to as a second value.

The workpiece stage assembly 20 holds and positions the workpiece 24 relative to the projection optical assembly 18 and the pattern beam 46. The workpiece stage assembly 20 can be controlled by the control system 22 to move and position the workpiece 24 along and/or about one or more axes to properly position the workpiece 24. For example, the workpiece stage assembly 20 can move and position the workpiece 24 in a plane that crosses the optical axis 25 of the projection optical assembly 18. The workpiece stage assembly 20 can include one or more planar motors, linear motors, voice coil motors, attraction only actuators, and/or other types of actuators. In certain embodiments, the workpiece stage assembly 20 moves the workpiece 24 during the transfer of the workpiece pattern 23 to the workpiece 24. For example, the control system 22 can control one or both the spatial light modulator 18 and the stage assembly 20 to expose a plurality of regions on the workpiece 24 using radiation from the projection optical system 18.

In one embodiment, the control system 22 is electrically coupled to and controls the illumination system 12, the digital phase mask 14, the mask stage assembly 16, and the workpiece stage assembly 20. For example, the control system 22 is electrically coupled to the programmable phase mask 14 to individually control the phase of each of the pixels 28 to create the mask pattern 425. Further, the control system 22 can (i) control the illumination system 12 to control the shaped illumination beam 38, (ii) control the workpiece stage assembly 20 to position the workpiece 24, and (iii) control the mask stage assembly 16 to position the phase mask 14.

The control system 22 can include one or more processors 22A and electronic data storage 22B that stores one or more mask patterns 425.

It should be noted that the pattern transfer apparatus 10 illustrated in FIG. 1A is illustrated as a transmissive programmable phase mask 14, and the beam shaping optics 42 and the projection optical assembly 18 have refractive optical elements. Alternatively, the phase mask 14 can be reflective, and the beam shaping optics 42 and the projection optical assembly 18 can include reflective elements.

A pattern transfer apparatus 10 having a programmable array are disclosed in, for example, U.S. Pat. Nos. 8,089,616; 8,405,816; and 8,792,081; and United States Patent Application Nos. US 2013/0222781; US 2013/0278912; and US 2013/0314683. As far as permitted, the disclosures in U.S. Pat. Nos. 8,089,616; 8,405,816; and 8,792,081 B2, and U.S. Patent Application Nos. US 2013/0222781; US 2013/0278912; US 2013/0314683 are incorporated herein by reference.

Figure 2A:
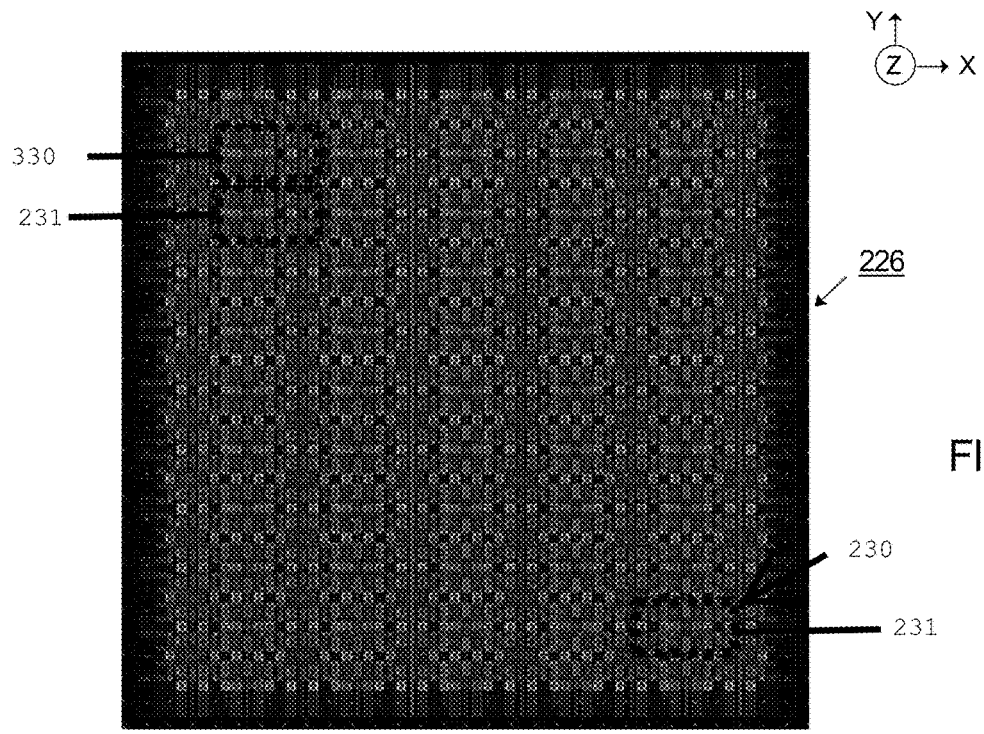
FIG. 2A is a simplified top view of a non-exclusive example of a desired workpiece pattern.

FIG. 2A is a top plan view of one, non-exclusive example of a desired workpiece pattern 226 ("circuit pattern") designed by a pattern designer. The desired workpiece pattern 226 is the pattern of features that the designer wishes to create on the workpiece 24 (illustrated in FIG. 1A). In this simplified example, the desired workpiece pattern 226 illustrated in FIG. 2A is actually a very small portion of a much larger, overall workpiece pattern. In this design, the desired workpiece pattern 226 can be repeated thousands of times to create the overall workpiece pattern.

In this example, the desired workpiece pattern 226 represents one-non-exclusive design of an SRAM to be created on the workpiece 24. However, the design of the desired workpiece pattern 226 can be changed based on the type of features that are desired to be created on the workpiece 24. As non-exclusive alternative examples, the desired workpiece pattern 226 can be DRAM, row-decoders, GPU, etc.

It should be noted that in certain embodiments, the desired workpiece pattern 226 includes a plurality of desired repetitive step cells 230 ("regions"). As used herein, the term "desired repetitive step cell" shall mean a subset pattern of features that are identical (same pattern) and repeated in multiple regions of the desired workpiece pattern.

Figure 3A:
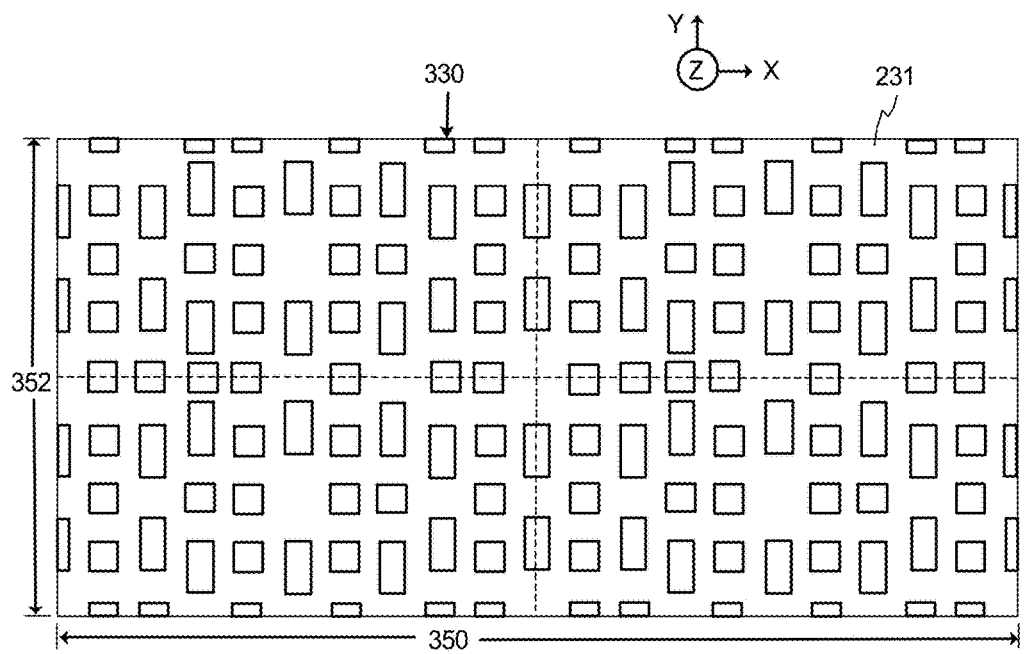
FIG. 3A is simplified top view illustration of another non-exclusive example of a desired repetitive step cell from FIG. 2A.

As provided herein, the desired repetitive step cell 230 can be selected to include a single repetitive pattern 231 (as illustrated in FIG. 2A) or multiple repetitive patterns 231 (as illustrated in FIG. 3A). As used herein, the term "repetitive pattern" shall mean a pattern of features that are identical and repeated in multiple regions of the desired workpiece pattern. For example, as provided in more detail below, in certain embodiments, the adjustment to a desired repetitive step cell 230 having a single repetitive pattern 231 can result in too much of a change. In this event, two, three, four, or more repetitive patterns 231 can be combined to create a desired repetitive step cell 230 that requires less, if any adjustment. In FIG. 2A, one of the desired repetitive step cells 230 is identified with a dashed rectangular box, and this desired repetitive step cell 230 is made up of a single repetitive pattern 231. Additionally, for illustration purposes, an alternative embodiment of the desired repetitive step cell 330 is also illustrated in FIG. 2A with a dashed rectangular box, and this desired repetitive step cell 330 is made up of four repetitive patterns 231 and is discussed in reference with FIGS. 3A and 3B.

Figure 2B:
FIG. 2B is an schematic illustration of the desired workpiece pattern of FIG. 2A.

FIG. 2B is a simplified top plan view of the desired workpiece pattern 226 without the features, but with the desired repetitive step cells 230. In this non-exclusive embodiment, the desired workpiece pattern 226 includes many alternative types of repetitive step cells 230. More specifically, in this embodiment, the desired workpiece pattern 226 includes (i) a plurality of first type of repetitive step cell 230A (labeled "cen" for center) which are located in the center of the workpiece pattern 26, and (ii) a plurality different step cells 230B located around the perimeter. For the different step cells 230B around the perimeter, (i) the label for the corner step cells start always begin with the letter "c" for corner; (ii) the label for the rightmost row of step cells start with the letter "r" for right; (iii) the label for the leftmost row of step cells start with the letter "l" for left; (iv) the label for the uppermost row of step cells start with the letter "t" for top; and (v) the label for the bottom-most row of step cells start with the letter "b" for bottom. A trailing "e" in the label refers to an edge element, that is, an element that is on the outer boundary other than a corner. A label with a trailing "ce" refers to "central element".

It should be noted that the workpiece pattern 226 illustrated in FIG. 2B is a small array to help illustrate the method provided herein. Without performing correction, all of the step-cells 230 that make up the array 226 are the same. However, when correction is performed, the influences (or proximity effects) of the neighboring features will have to be considered. Additionally, the features that are outside of the array 226 must be considered. For example, this array 226 may represent a repeating logic circuit, SRAM, etc. When it is placed in the layout, it might have neighbors (outside of this array) that are different on each side. If those elements are far enough away from this array 226 as to not influence and change the correction then you can use that in the sub-array corrections. This is discussed below.

What should be noted is that when forced grid corrections are applied, the array applies the pixel symmetry to the array elements. The worst case is illustrated in FIG. 2B where different corrections are required for the four sides and four corners (the perimeter step cells 230B).

The width and size of the boxes assume that the influence range is close to the same size as the box (this comes out of the model that is used in the correction). As a result thereof, the following can be performed if conditions permit: (i) if there is full symmetry in the layout, i.e. both X, Y and mirroring, then the step cells labeled beginning with "t" and "b" are the same, and step cells labeled beginning with "r" and "l" are the same; and the corner step cells labeled "ctl", "ctr", "cbl" and "cbr" also become the same (since they may be flipped and placed in the array); (ii) if the top and bottom have symmetry then the step cells that are labeled beginning with "t" and "b" are the same; or (iii) if left and right are symmetric then the step cells that are labeled beginning with "l" and "r" are the same.

All of this assumes that the interacting features outside of the cell (which is this array) are far enough away to not affect the correction of the pixelated forced gridding.

Now if there is periphery that is not the same on the four sides (left, right, bottom and top) then none of the above is true, and unique corrections are required for all of sub-cells in this array (as shown in the FIG. 2B).

It should be noted that only a five by five array of "cen" step cells 230A are illustrated in FIG. 2B. Typically, the number of "cen" step cells 230A will be very large. As a non-exclusive example, the array could include a five thousand by five thousand array of "cen" step cells 230A. Additionally, the features of each of first type of repetitive step cells 230A labeled "cen" is exactly the same. The repetitive step cells can also be referred to as regions.

As provided herein, the desired workpiece pattern 226 and one or more of the desired repetitive step cells 230 may not correspond exactly to the size of the pixels 28 (illustrated in FIG. 1B) of the phase mask 14 (illustrated in FIG. 1B). In one embodiment, the force grid method provided herein evaluates each of the types of desired repetitive step cells 230 and resizes these desired repetitive step cells 230 (if necessary) to correspond to the size of the pixels 28.

In the non-exclusive embodiment illustrated in FIG. 2B, the plurality of first type of repetitive step cells 230A ("regions") (i) are arranged along the X and Y axes (first and second direction); (ii) are arranged as a two-dimensional array; and (iii) are adjacent to each other. Further, the plurality of regions 230A are each rectangular shaped.

Figure 2C:
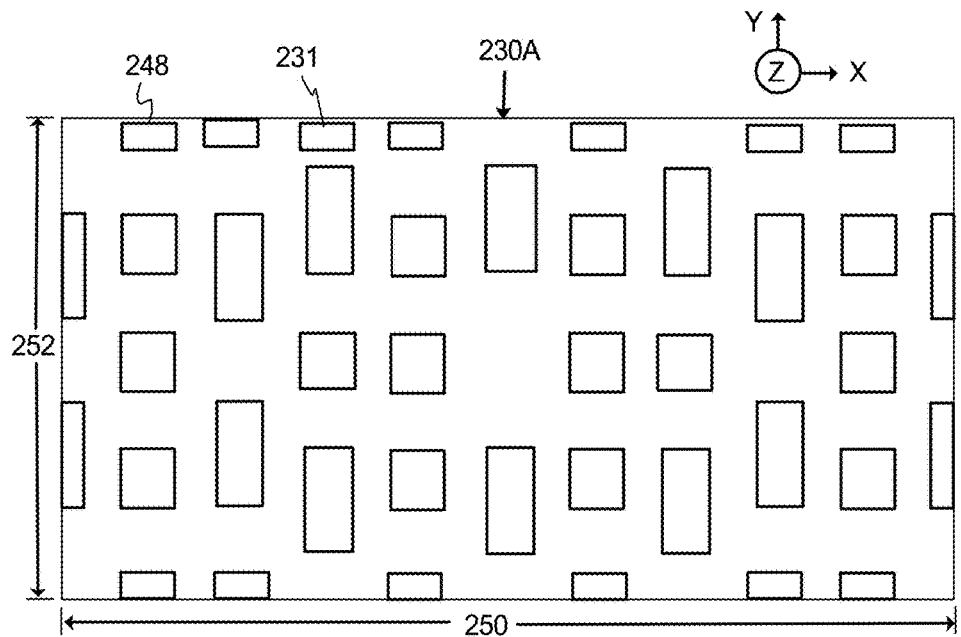
FIG. 2C is simplified top view illustration of a non-exclusive example of a desired repetitive step cell from FIG. 2A.

FIG. 2C is a simplified top view of one of the first types of desired repetitive step cells 230A that includes one repetitive pattern 231. It should be noted that the other first types of desired repetitive step cells 230A have the same design (same pattern) and are adjusted in the same fashion. Further, it should be noted that the other types of desired repetitive step cells 230B can be processed in a somewhat similar fashion.

In the simplified illustration of FIG. 2C, the first type, desired repetitive step cells 230A has four fold symmetry. By recognizing this four fold symmetry, the problem and calculation can be further reduced since the pixel correction must also use this symmetry. However, four fold symmetry is necessary for the types of desired repetitive step cells 230B-230D.

In this embodiment, the desired repetitive step cells 230A includes a plurality of features 248 that are desired to be transferred to the workpiece 24 (illustrated in FIG. 1A). As provided herein, the desired repetitive step cell 230A includes a desired step cell width 250 measured along a direction, e.g. the first ("X") axis, and a desired step cell length 252 measured along another direction, e.g. the second ("Y") axis. As a non-exclusive, first example, the desired step cell width 250 can be seven hundred and twenty-two (722) nanometers and the desired step cell length 252 can be three hundred and eighty three (383) nanometers.

It should be noted that (i) the desired step cell width 250 can also be referred to as a desired region dimension measured along a direction; and/or (ii) the desired step cell length 252 can also be referred to a desired region dimension measured along a direction. Either of the desired region dimensions can be referred to as a first desired region dimension, or a second desired region dimension. For example, each step cell 230A can be referred to as having a first desired region dimension measured along a first direction and a second desired region dimension measured along a second direction.

Next, the present invention evaluates the desired repetitive step cell 230A to determine if it corresponds to the pixel size of the phase mask 14 (illustrated in FIG. 1A) and the optical adjustment factor of the projection optical assembly 18. As provided herein, the present invention (i) evaluates if the desired step cell width 250 is equal to a first integer ("Nx") multiplied by a first value; and (ii) evaluates if the desired step cell length 252 is equal to a second integer ("Ny") multiplied by a second value. In this embodiment, the first value is equal to the pixel width 28A multiplied by the optical adjustment factor of the projection optical assembly 18. Similarly, the second value is equal to the pixel length 28B multiplied by the optical adjustment factor of the projection optical assembly 18.

As a non-exclusive example, each pixel 28 of the phase mask 14 can have a pixel width 28A of twelve (12) nanometers and a pixel length 28B of twelve (12) nanometers; and the projection optical assembly 18 can have an optical adjustment faction of one so that the effective pixel 48 has an effective pixel width 48A of twelve (12) nanometers and an effective pixel length 48B of twelve (12) nanometers. For the example provided above, the desired step cell width 250 of seven hundred and twenty-two nanometers is not equal to a first integer ("Nx") multiplied by the first value (pixel width 28A multiplied by the optical adjustment factor) (722 nm≠Nx*12 nm*1). Further, for the example provided above, the desired step cell length 252 of three hundred and eighty three is not equal to a second integer ("Ny") multiplied by the second value (pixel length 28B multiplied by the optical adjustment factor) (383 nm≠Ny*12 nm*1).

Figure 2D:
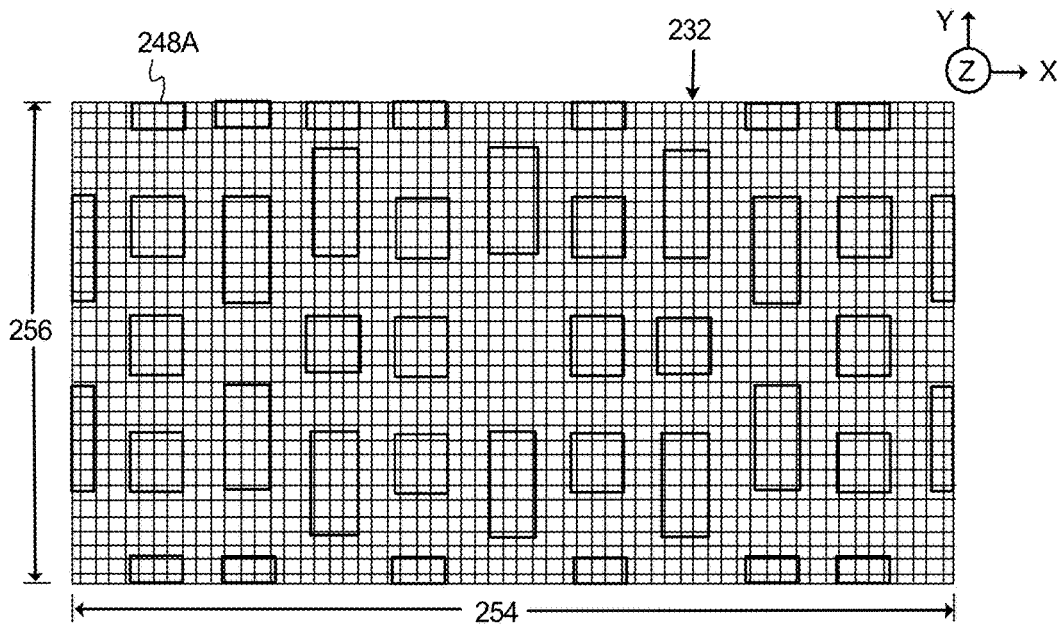
FIG. 2D is simplified top view illustration of a non-exclusive example of an adjusted repetitive step cell.

Referring to FIGS. 2C and 2D, in the event, the desired step cell width 250 is not equal to the first integer ("Nx") multiplied by the effective pixel width 48A (pixel width 28A multiplied by the optical adjustment factor), and the desired step cell length 252 is not equal to the second integer ("Ny") multiplied by the effective pixel length 48B (pixel length 28B multiplied by the optical adjustment factor), the present invention resizes (e.g. scales) the desired repetitive step cells 230A to fit these design parameters and create the adjusted, repetitive step cell 232 that better corresponds to the size of the effective pixels 48. As non-exclusive examples, the desired repetitive step cells 230A is enlarged, reduced or manipulated so that the adjusted, repetitive step cell 232 better corresponds to the size of the effective pixels 48. Alternatively, in certain embodiments, the optical adjustment factor of the projection optical assembly 18 can be enlarged, reduced or manipulated so that the adjusted, repetitive step cell 232 better corresponds to the size of the pixels 28.

As provided herein, the adjusted ("modified") repetitive step cell 232 includes an adjusted step cell width 254 measured along a direction, e.g. the first ("X") axis, and an adjusted step cell length 256 measured along another direction, e.g. the second ("Y") axis. Further, as provided herein, the present invention adjusts the desired repetitive step cells 230A so that (i) the adjusted step cell width 254 is equal to a first integer ("Nx") multiplied by the first value (pixel width 28A multiplied by the optical adjustment factor); and (ii) the adjusted step cell length 256 is equal to a second integer ("Ny") multiplied by the second value (pixel length 28B multiplied by the optical adjustment factor).

In the simplified example provided herein, the desired repetitive step cells 230A can be adjusted so that (i) the desired step cell width 250 of seven hundred and twenty-two nanometers is reduced so that the adjusted step cell width 254 is seven hundred and twenty nanometers; and (ii) the desired step cell length 252 of three hundred and eighty three nanometers is increased so that the adjusted step cell length 256 is three hundred and eighty four nanometers. With this design, (i) the adjusted step cell width 254 of seven hundred and twenty nanometers is equal to a first integer ("Nx") multiplied by the first value (720 nm=60*12 nm*1); and (ii) the adjusted step cell length 256 of three hundred and eighty four nanometers is equal to a second integer ("Ny") multiplied by the second value (384 nm=32*12 nm*1). In this example, the first integer is sixty and the second integer is thirty-two.

It should be noted that the small amount of adjustment from the desired repetitive step cells 230A to the adjusted repetitive step cell 232 with its adjusted features 248A should not adversely influence the functioning of the actual workpiece pattern 23 (illustrated in FIG. 1A) and the adjusted repetitive step cell 232 will function as a symmetric template that can be used for similar corrections for the other first type, repetitive step cells 230A.

Moreover, the adjusted repetitive step cell 232 has maintained the four fold symmetry.

It should be noted that (i) the adjusted step cell width 254 can also be referred to as an adjusted region dimension measured along a direction; and/or (ii) the adjusted step cell length 256 can also be referred to an adjusted region dimension measured along a direction. Either of the desired region dimensions can be referred to as a first adjusted region dimension, or a second adjusted region dimension. For example, each adjusted step cell 232 can be referred to as having a first adjusted region dimension measured along a first direction and a second adjusted region dimension measured along a second direction.

Additionally, it should be noted that each of the other desired repetitive step cells 230B-230D can be individually evaluated and modified to generate a separate adjusted repetitive step cell. For example, (i) the second type, desired repetitive step cells 230B can be evaluated and adjusted (similar to above) to provide a second type, adjusted repetitive step cell (not shown) which would function as a template for the second type, desired repetitive step cells 230B; (ii) the third type, desired repetitive step cells 230C can be evaluated and adjusted (similar to above) to provide a third type, adjusted repetitive step cell (not shown) which would function as a template for the third type, desired repetitive step cells 230C; and (iv) the fourth type, desired repetitive step cells 230D can be evaluated and adjusted (similar to above) to provide a fourth type, adjusted repetitive step cell (not shown) which would function as a template for the fourth type, desired repetitive step cells 230D.

Furthermore, it should be noted that a plurality of pixels 28 are also illustrated in FIG. 2D. In this example, the adjusted repetitive step cell 232 is positioned so that there are 1/2 pixels around the perimeter. This is necessary in order to maintain continuity at the boundary with the pixels 28 (and phase) when the cell is positioned in the step cell array.

It should be noted that in certain embodiments, the first integer ("Nx") and the second integer ("Ny") are each multiples of two. Stated in another fashion, each integer can be an even integer. As a result thereof, the adjusted repetitive step cell 232 can be positioned so that there are 1/2 pixels around the perimeter.

Although the forced grid method provided herein is easier for a desired repetitive step cell that is an even number multiple of the pixel size, it also works for the odd number too. In this latter case the correction is still performed on the desired repetitive step cell to generate the adjusted repetitive step cell as shown in FIG. 2D, but the output will mirror this correction output as the new step cell. This way there is no conflict with the boundary (that include ½ the pixel size). Indeed, in the case which have an odd number integer, the correction is "mirror symmetry" and not step symmetry.

Importantly, the desired repetitive step cells 230 of FIG. 2C can be modified in another fashion for other pixel sizes. In another example, the pixel 28 can have a pixel width 28A of ten (10) nanometers and a pixel length 28B of ten (10) nanometers. In this example, the optical adjustment factor is again 1. For the example provided above, the desired step cell width 250 of seven hundred and twenty-two nanometers is not equal to a first integer ("Nx") multiplied by the first value (722 nm≠Nx*10 nm*1). Further, for the example provided above, the desired step cell length 252 of three hundred and eighty three is not equal to a second integer ("Ny") multiplied by the second value (383 nm≠Ny*10 nm*1).

In this example, the desired step cell width 250 can be resized (e.g. scaled) to fit these new design parameters to create the adjusted, repetitive step cell 232 that better corresponds to the size of the ten nanometer pixels 28. In the simplified example, the desired repetitive step cells 230A can be adjusted so that (i) the desired step cell width 250 of seven hundred and twenty-two nanometers is reduced so that the adjusted step cell width 254 is seven hundred and twenty nanometers; and (ii) the desired step cell length 252 of three hundred and eighty three nanometers is decreased so that the adjusted step cell length 256 is three hundred and eighty nanometers. With this design, (i) the adjusted step cell width 254 of seven hundred and twenty nanometers is equal to a first integer ("Nx") multiplied by the first value (720 nm=72*10 nm*1); and (ii) the adjusted step cell length 256 of three hundred and eighty nanometers is equal to a second integer ("Ny") multiplied by the second value (380 nm=38*10 nm*1). In this example, the first integer is seventy-two and the second integer is thirty-eight.

It should be noted that the desired repetitive step cells 230A can be different than that illustrated in FIG. 2C. In another example, if the desired repetitive step cell 230A has a desired step cell width 250 of seven hundred and twenty-five (725) nanometers and a desired step cell length 252 of three hundred and eighty four (384) nanometers. In this example, for a ten nanometer pixel 28, there is (i) a five nanometer change along the X axis between the desired cell width 250 of seven hundred and twenty-five and the adjusted step cell width 252 of seven hundred and twenty (720 nm=72*10 nm*1); and (ii) a four nanometer change along the Y axis between the desired cell length 252 of three hundred and eighty four, and the adjusted step cell length 256 of three hundred and eighty (380 nm=38*10 nm*1). This may be too much of a design change. Thus, as provided herein, another step cell can be selected.

In yet another example, (i) the desired repetitive step cell 230A has a desired step cell width 250 of seven hundred and twenty-five (725) nanometers and a desired step cell length 252 of three hundred and seventy five (375) nanometers; and (ii) the pixel 28 has a pixel width 28A of ten (10) nanometers and a pixel length 28B of ten (10) nanometers. In this example, the projection optical assembly 18 is designed so that the optical adjustment factor is adjustable. In one example, the optical adjustment factor can be adjusted to 0.5. With this example, the desired step cell width 250 of seven hundred and twenty-five nanometers is equal to a first integer ("Nx") multiplied by the first value (pixel width 28A multiplied by the optical adjustment factor) (725 nm=Nx*10 nm*0.5). Further, for the example provided above, the desired step cell length 252 of three hundred and seventy five is equal to a second integer ("Ny") multiplied by the second value (pixel length 28B multiplied by the optical adjustment factor) (375 nm=Ny*10 nm*0.5). Alternatively, if the optical adjustment factor can be adjusted to 2.5; the desired step cell width 250 of seven hundred and twenty-five nanometers is equal to a first integer ("Nx") multiplied by the first value (725 nm=Nx*10 nm*2.5); and the desired step cell length 252 of three hundred and seventy five is equal to a second integer ("Ny") multiplied by the second value (375 nm≠Ny*10 nm*2.5). Thus, the optical adjustment factor of the projection optical system 18 can be adjusted so that (i) the desired step cell width 250 is equal to the first integer ("Nx") multiplied by the first value; and (ii) the desired step cell length 252 is equal to the second integer ("Ny") multiplied by the second value.

FIG. 3A is a simplified top view of another embodiment of the first type of desired repetitive step cells 330 that was selected from the desired workpiece pattern 226 of FIG. 2A. In this example, the desired repetitive step cell 330 includes four of the repetitive patterns 231 combined together. A dashed divider is provided in FIG. 3A to illustrate the four repetitive patterns 231. Thus, using the numbers from the previous paragraph, this desired repetitive step cell 330 has a desired step cell width 350 of fourteen hundred and fifty (1450) nanometers, and a desired step cell length 352 of seven hundred and sixty-eighty (768) nanometers.

Figure 3B:
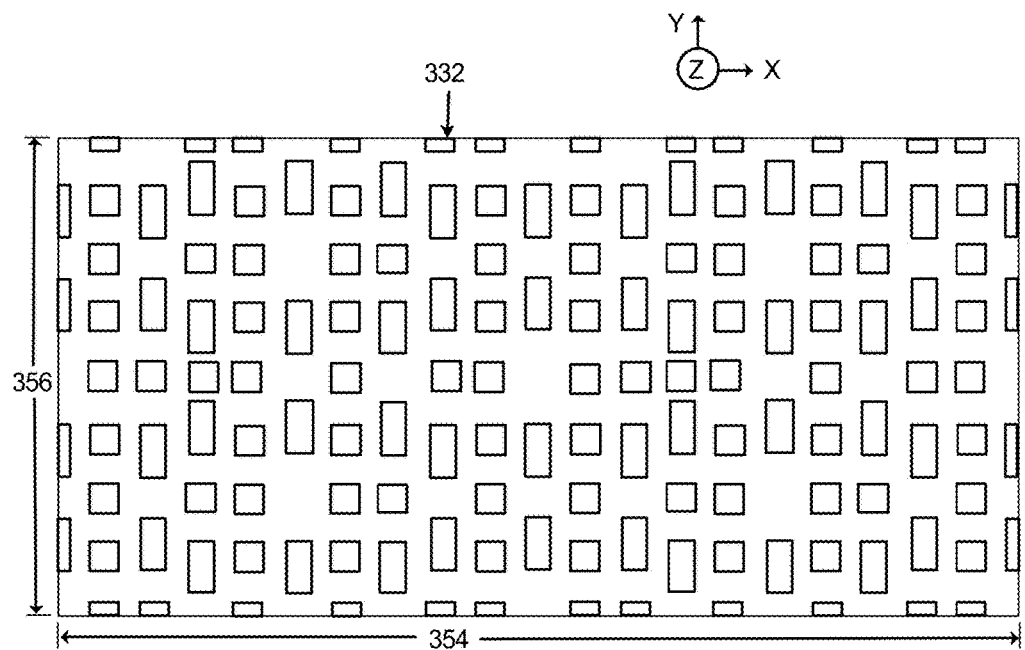
FIG. 3B is simplified top view illustration of another non-exclusive example of an adjusted repetitive step cell.

FIG. 3B illustrates the resulting adjusted repetitive step cell 332 including the adjusted step cell width 354 and the adjusted step cell length 356. With reference to FIGS. 3A and 3B, for a ten nanometer pixel 28, and an optical adjustment factor of one, the desired step cell width 350 does not need modification because fourteen hundred and fifty (1450) nanometers is equal to a first integer ("Nx") multiplied by the first value (pixel width 28A multiplied by the optical adjustment factor) (1450 nm=145*10 nm*1). However, the desired step cell length 352 needs a two nanometer adjustment so that the adjusted step cell length 356 is seven hundred and seventy (770) nanometers is equal to a second integer ("Ny") multiplied by the second value (pixel length 28B multiplied by the optical adjustment factor) (770 nm=77*10 nm*1).

It should be noted that the required amount of modification between the desired repetitive step cell 330 and adjusted repetitive step cell 332 can be changed by the selection of the repetitive step cell 330. For example, the required amount of modification between the desired repetitive step cell 330 and adjusted repetitive step cell 332 can be changed by selecting the adjusted repetitive step cell 332 to include more than one repetitive patterns 231. Stated in another fashion, multiple repeatable patterns 231 can be combined to select the best desired repetitive step cell 330 that is best suited for the pixel size. Additionally, or alternatively, in certain embodiments, the optical adjustment factor can also be adjusted.

Additionally, it should be noted that the second integer "77" in the previous example, is not an even integer. Thus, in certain embodiments, it may be best to select another desired repetitive step cell 330. For example, it may be better to combine only two of the repetitive patterns 231 positioned side-by-side along the X axis to create the desired repetitive step cell 230 from FIG. 2C.

Figure 4A:
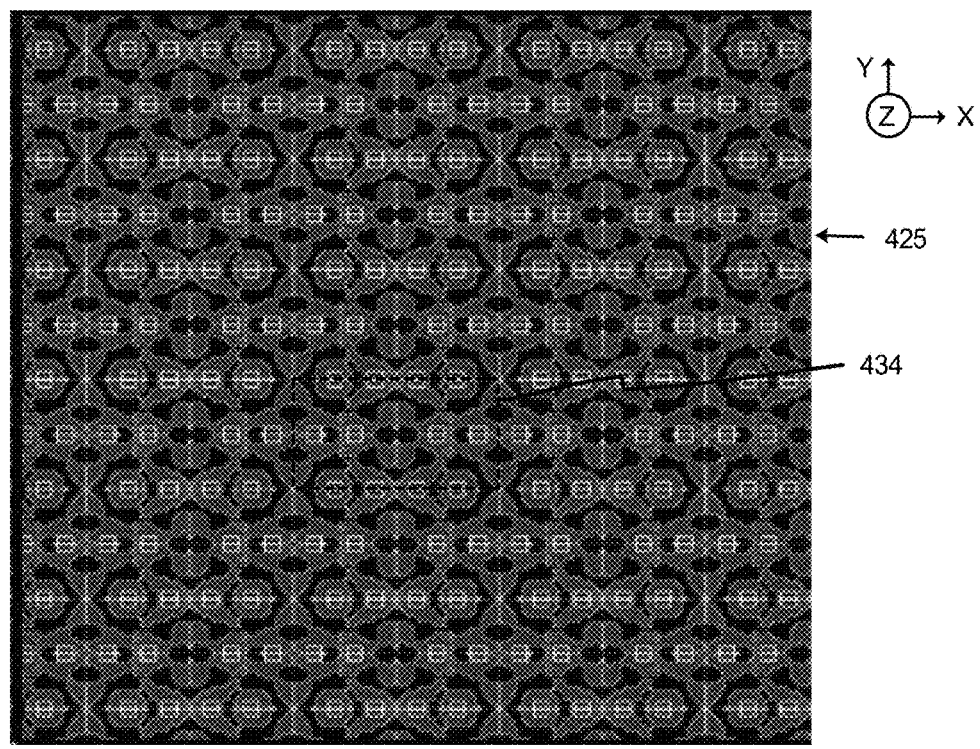
FIG. 4A is simplified top view illustration of a non-exclusive example of a mask pattern.
Figure 4B:
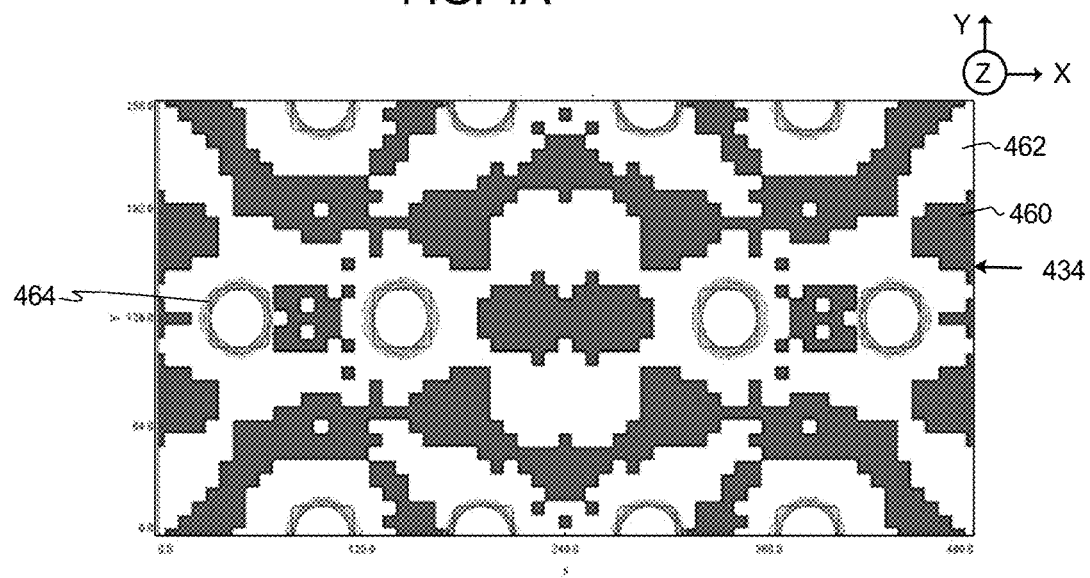
FIG. 4B is simplified top view illustration of a non-exclusive example of a mask stepping array from the mask pattern of FIG. 4A.

Next, as provided herein, the adjusted repetitive step cell 232, 332 can be used to create a mask stepping array 434 (illustrated in FIG. 4A) and the mask pattern 425. FIG. 4A is simplified top view illustration of a non-exclusive example of a mask pattern 425 used to create the workpiece pattern 23 (illustrated in FIG. 1A), and FIG. 4B is simplified top view illustration of a non-exclusive example of a mask stepping array 434 from the mask pattern 425 of FIG. 4A. It should be noted that one of the mask stepping arrays 434 is also identified in FIG. 4A with a dashed box.

In FIG. 4B, the grey areas 460 represent pixels having a PI phase and the white areas 462 represent pixels having a zero phase. Further, the circular and square groups of lines 464 are portions of the actual workpiece pattern that has been transferred to the workpiece as a result of this mask stepping array 434.

It should be noted that the mask stepping array 434 illustrated in FIG. 4B can be repeated to create the mask pattern 425 used to control the phase mask 14. This greatly simplifies the pixel correction for the mask pattern 425 and minimizes the amount of data required to be stored for the mask pattern 425. Further, with this design, the mask pattern 425 has been adjusted to match the pixel size and the optical adjustment factor. Moreover, the mask stepping array 434 has four fold symmetry in this example.

As provided above, in certain embodiments, the desired repetitive step cell is selected so that the adjusted repetitive step cell is an even integer multiple of the pixel size. Alternatively, an odd integer works as well, but it requires a different type of boundary for the step cell.

Figure 5A:
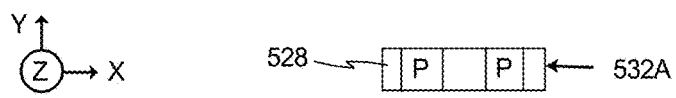
FIG. 5A is a simplified illustration of the pixels for a small adjusted repetitive step cell.

FIG. 5A is a simplified illustration of the pixels 528 for a small adjusted repetitive step cell 532A. In this example, the adjusted repetitive step cell 532A has a four ("even integer") pixel width (along the X axis) and a single ("odd integer") pixel length (along the Y axis). In FIGS. 5A-5E, the pixels 528 controlled to be a Pi phase are represented with a "P", while the pixels 528 controlled to be a 0 phase are left blank.

Figure 5B:
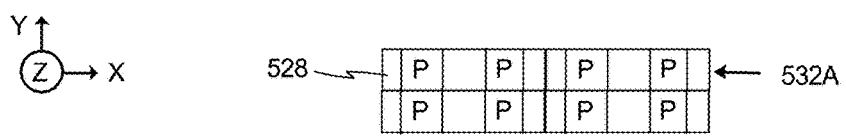
FIG. 5B is a simplified illustration of the pixels when four of the adjusted repetitive step cells from FIG. 5A have been combined.

FIG. 5B is a simplified illustration of the pixels 528 when four of the adjusted repetitive step cells 532A from FIG. 5A have been combined. FIG. 5B illustrates that the small adjusted repetitive step cell 532A can be repeated even though it is an odd integer pixel length.

Figure 5C:
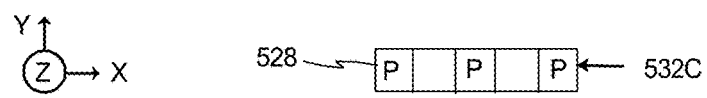
FIG. 5C is a simplified illustration of the pixels for another embodiment of a small adjusted repetitive step cell.

FIG. 5C is a simplified illustration of the pixels 528 for another embodiment of a small adjusted repetitive step cell 532C. In this example, the adjusted repetitive step cell 532A has a five ("odd integer") pixel width (along the X axis) and a single ("odd integer") pixel length (along the Y axis). In this example, the correction must now fall on the edge of the pixel 528, and not at ½ the pixel size. This still works but has an impact on the correction.

Figure 5D:
FIG. 5D is a simplified illustration when two of the adjusted repetitive step cells from FIG. 5C have been combined along the X axis.

FIG. 5D is a simplified illustration of the pixels 528 when two of the adjusted repetitive step cells 532C from FIG. 5C have been combined along the X axis. FIG. 5D illustrates that the center now has two of the same phase pixels adjacent to each other. This is still ok but the correction must account for the conflict and it also reduces the effectiveness (or ability) to find a solution for the correction.

Figure 5E:
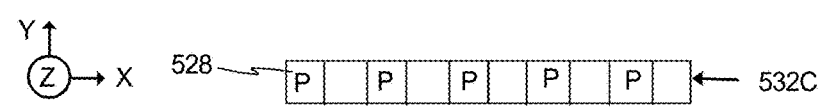
FIG. 5E is a simplified illustration when two of the adjusted repetitive step cells from FIG. 5C have been combined along the X axis in another fashion.

Alternatively, FIG. 5E is a simplified illustration of the pixels 528 when two of the adjusted repetitive step cells 532C from FIG. 5C have been combined along the X axis in another fashion. In this example, in the case of an odd number of pixels, it can be best for the correction to use a mirror phase for the adjusted repetitive step cell 532C.

Figure 5F:
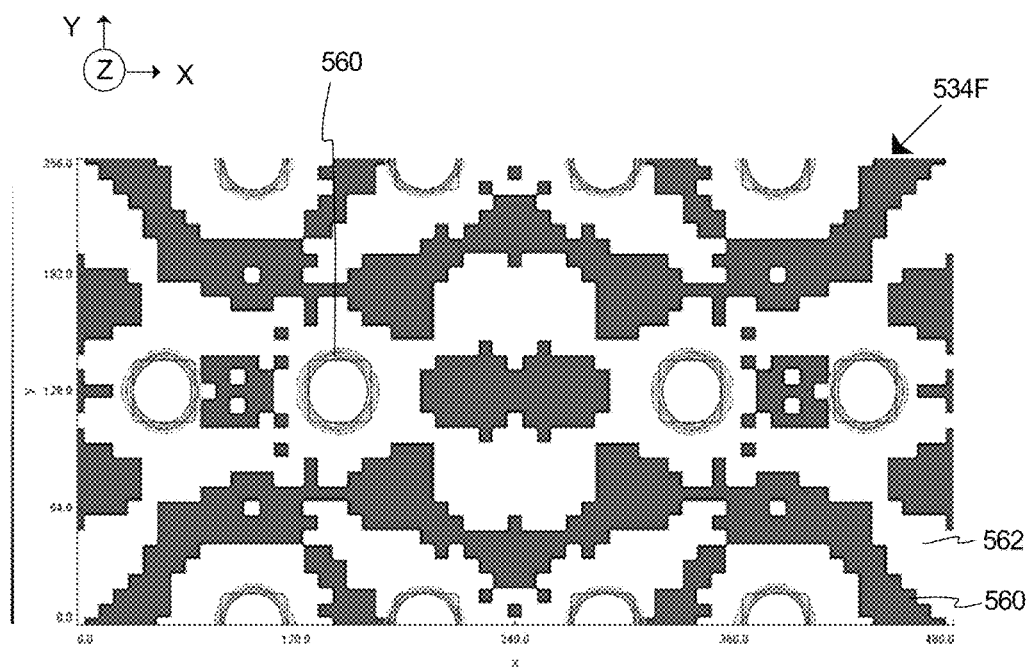
FIG. 5F is simplified top view illustration of another non-exclusive example of a mask stepping array.
Figure 5G:
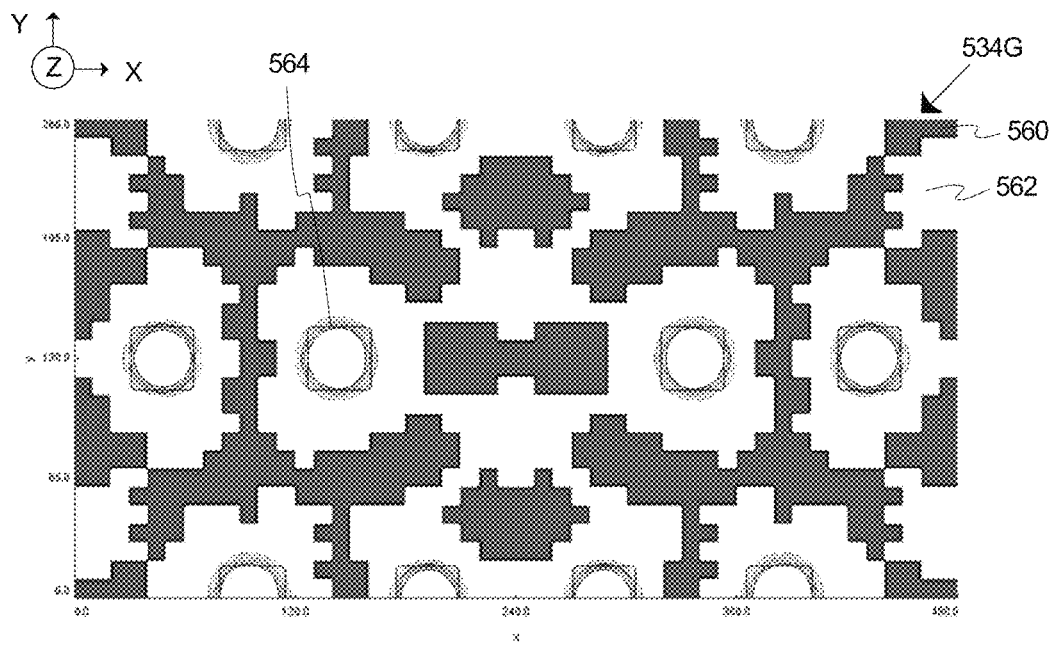
FIG. 5G is simplified top view illustration of still another non-exclusive example of a mask stepping array.

FIG. 5F is simplified top view illustration of another non-exclusive example of a mask stepping array 534F, and FIG. 5G is simplified top view illustration of still another non-exclusive example of a mask stepping array 534G. In these Figures, the grey areas 560 represent pixels having a PI phase and the white areas 562 represent pixels having a zero phase. Further, the circular and square groups of lines 564 are portions of the actual workpiece pattern that has been transferred to the workpiece as a result of this mask stepping array.

FIG. 5F is for an eight nanometer pixel size and FIG. 5G is for a ten nanometer pixel size. Each Figure has an odd number of pixels with full pixels on the edge (rather than ½ pixel).

Figure 6:
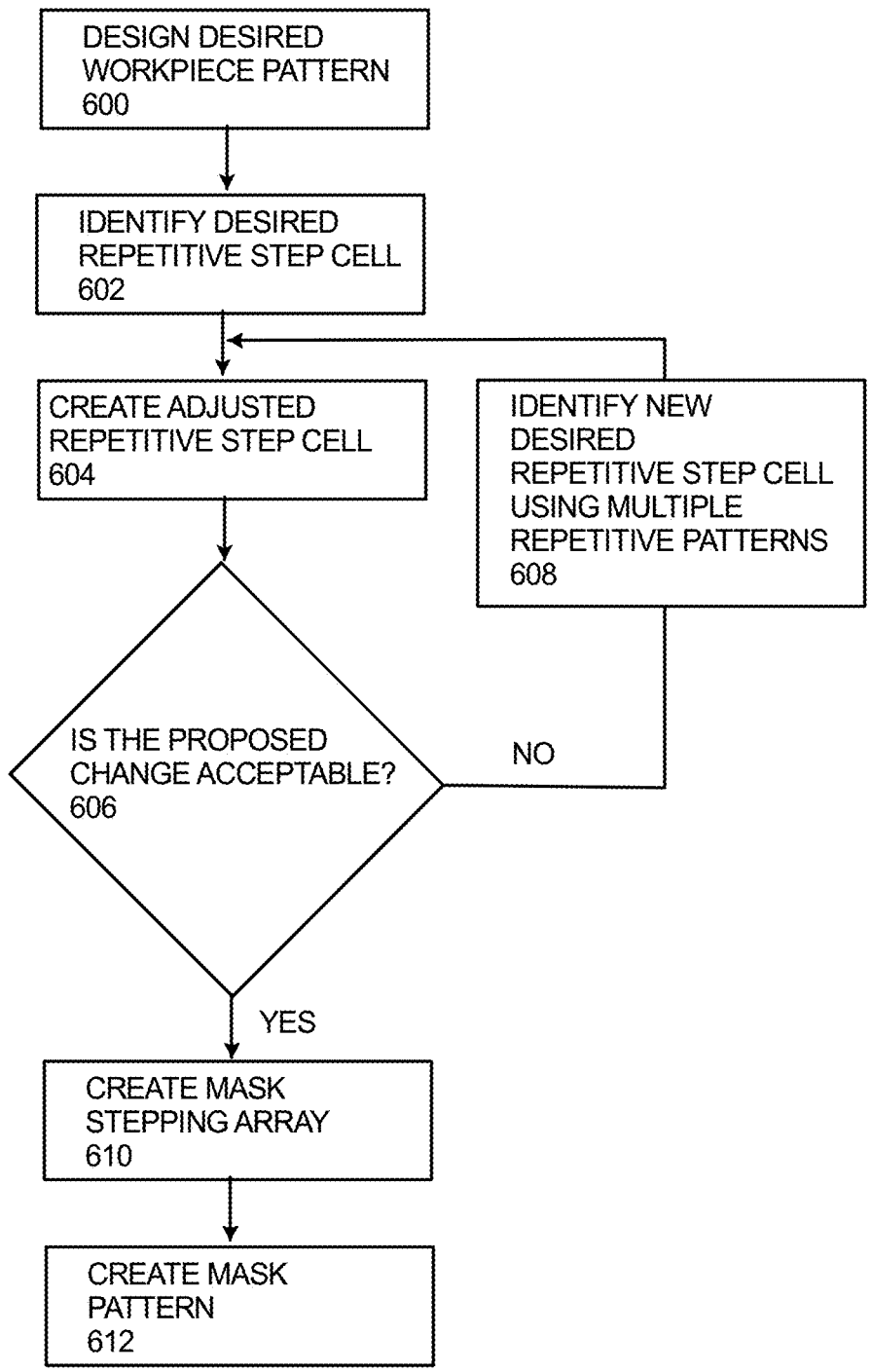
FIG. 6 illustrates a representative method for determining a mask pattern.

FIG. 6 is a simplified block diagram that outlines some of the steps utilized in the present invention. It should be noted that some or all of the steps provided herein can be performed by a pattern designer using the computer 36. In certain embodiments, each of the steps is performed by the computer 36.

At block 600, a desired workpiece pattern is designed. The actual design will depend upon the desired features on the wafer.

Next, at block 602, the desired workpiece pattern can be evaluated to identify one or more desired repetitive step cells in the desired workpiece pattern 226.

Subsequently, at block 604, the size and/or shape of the desired repetitive step cell can be adjusted, if necessary to create an adjusted repetitive step cell that better corresponds to the size of the pixels, and/or the optical adjustment factor can be adjusted. As provided herein, the desired repetitive step cell can be increased and/or decreased as necessary to match the pixel and optical adjustment factor multiple and create the adjusted repetitive step cell. As a non-exclusive example, for a design that uses a metric of "area", the adjusted step cell width and the adjusted step cell length can be modified differently, e.g. one can be increased while the other is decreased or vice versa in order more accurately match the intended design "area" of the step cell.

Next, at block 606, the desired repetitive step cell can be compared to the adjusted repetitive step cell to evaluate if the proposed adjustments are acceptable. As provided above, a small amount of adjustment from the desired repetitive step cells to the adjusted repetitive step cell with its adjusted features should not adversely influence the functioning of the actual workpiece pattern. As alternative, non-exclusive examples, in certain embodiments, changes of less than approximately 0.5, 1, 1.5, 2, 3, 4, or 5 percent between the desired repetitive step cells and the adjusted repetitive step cell should be acceptable.

It should be noted that the percent value will be dependent on the size of the desired repetitive step cell. For example, with an optical adjustment factor of one, if the desired repetitive step cell has desired step cell width of 238 nm and a desired cell length=128 nm for a 10 nm pixel size, it can be resized so that the adjusted repetitive step cell has an adjusted step cell width of 240 nm and an adjusted step cell length of 130 nm. This would represent a difference of +0.8% to the step cell width, +1.5% changes to the step cell length, and a step cell area change of +2.35%. In this example, the desired repetitive step cell includes a single repetitive pattern.

Alternatively, perhaps an adjusted step cell width of 235 nm and an adjusted step cell length of 130 nm would be acceptable. In this case, the desired repetitive step cell can be selected to include two repetitive patterns, and the forced grid method provided herein could provide an adjusted step cell width of 470 nm and an adjusted step cell length of 130 nm. This now is only a −0.28% change of the cell size from the original intended design. Still, if this value is too large, the force grid method could select the desired repetitive step cell that is exact, i.e. no error to the intended design, that has a desired step cell width of 1190 nm, and a desired step cell length of 640 nm.

If the proposed changes are not acceptable, at block 608, a new desired repetitive step cell can be selected using multiple repetitive patterns positioned adjacent to each other. Next blocks 604-608 are repeated until the proposed changes are acceptable.

Once the proposed changes are acceptable, at block 610, the adjusted repetitive step cell can be used to create a mask stepping array that is matched to the size of the pixel used in the phase mask. At this step, the control system can convert the mask stepping array to drive data for the plurality of pixels of the spatial light modulator (digital phase mask). The drive data can be the phase value for each pixel in the digital phase mask necessary to expose the desired mask stepping array on the workpiece.

Finally, at block 612, the mask stepping array is sequentially and repeatably transferred via radiation from the digital phase mask to expose the workpiece to create the mask pattern that is transferred to the workpiece. With this design, the radiation from the digital phase mask exposes a photosensitive substrate on the workpiece to transfer the predetermined pattern to the workpiece. It should be noted that the workpiece and/or the digital phase mask can be moved between sequentially transferred mask stepping arrays. Stated in another fashion, the workpiece and/or the digital phase mask can be stepped between subsequent exposures of the various regions of the workpiece.

With this design, the mask pattern is preprocessed prior to printing to adjust to the pixel size of the phase mask and the optical adjustment factor. Because, the correction utilizes a repeating pattern, the correction can be performed quickly for really large mask patterns.

It should be noted that the process in FIG. 6 can be repeated to identify another desired repetitive step cell which is subsequently transferred to one or more regions on the workpiece. It should be noted that the repetitive step cell and/or the optical adjustment factor can be adjusted between exposing different regions of the workpiece.

Figure 7:
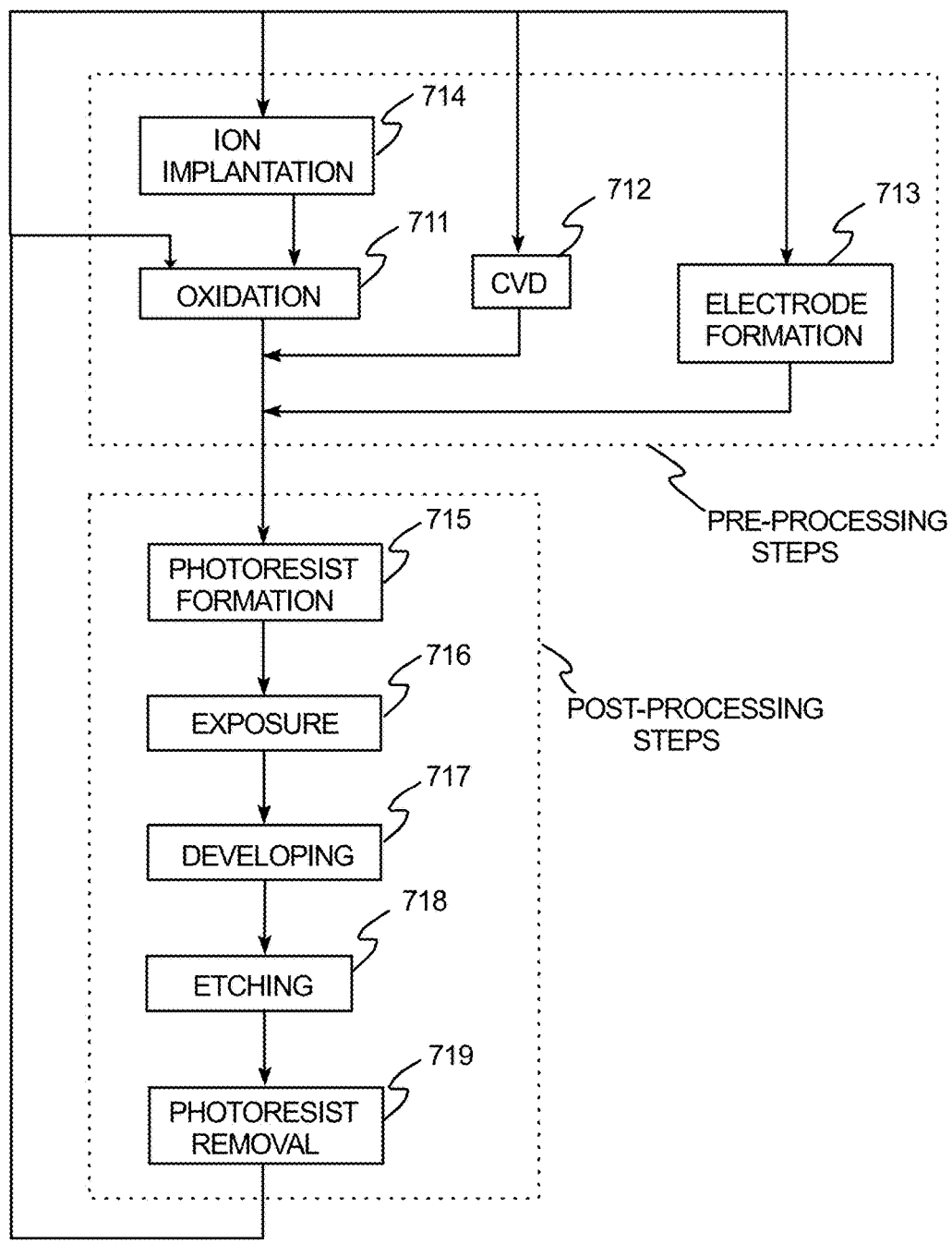
FIG. 7 illustrates a representative method for manufacturing method.

Representative details of a wafer-processing process including a micro lithography step are shown in FIG. 7. In step 711 ("oxidation") the wafer surface is oxidized. In step 712 ("CVD") an insulative layer is formed on the wafer surface by chemical-vapor deposition. In step 713 (electrode formation) electrodes are formed on the wafer surface by vapor deposition, for example. In step 714 ("ion implantation") ions are implanted in the wafer surface. These steps 711-714 constitute representative "pre-processing" steps for wafers, and selections are made at each step according to processing requirements.

At each stage of wafer processing, when the preprocessing steps have been completed, the following "postprocessing" steps are implemented. A first post-process step is step 715 ("photoresist formation") in which a suitable resist is applied to the surface of the wafer. Next, in step 716 ("exposure"), the dithered exposure systems and methods described above are used for transferring a pattern from the phase array to the resist layer on the wafer. In step 717 ("developing") the exposed resist on the wafer is developed to form a usable mask pattern, corresponding to the resist pattern, in the resist on the wafer. Bridging and other phase conflict resolution patterns can be used. In step 718 ("etching"), regions not covered by developed resist (i.e., exposed material surfaces) are etched away to a controlled depth. In step 719 ("photoresist removal"), residual developed resist is removed ("stripped") from the wafer.

The following discussion is intended to provide a brief, general description of an exemplary computer in which the disclosed technology may be implemented. Although not required, the disclosed technology is described in the general context of computer-executable instructions, such as program modules, being executed by a personal computer (PC). Generally, program modules include routines, programs, objects, components, data structures, etc., that perform particular tasks or implement particular abstract data types. Moreover, the disclosed technology may be implemented with other computer system configurations, including hand-held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules may be located in both local and remote memory storage devices.

An exemplary system for implementing the disclosed technology includes a general purpose computing device in the form of an exemplary computer 36, including one or more processing units, a system memory, and a system bus, that couples various system components including the system memory to the one or more processing units. The system bus may be any of several types of bus structures including a memory bus or memory controller, a peripheral bus, and a local bus using any of a variety of bus architectures. The exemplary system memory includes read only memory (ROM) and random access memory (RAM). A basic input/output system (BIOS), containing the basic routines that help with the transfer of information between elements within the computer 36, is stored in ROM. Typically one or more storage devices or a memory such as memory, or a communication connection is coupled to store or communicate pattern definitions and first and second phase patterns and associated exposures. The memory can also include computer-executable instructions for dividing a pattern is sets of primary and dithered exposures, and in some examples, these exposures are based on photoresist characteristics so as to achieve a preferred exposure. Circuit patterns can be stored in a memory and retrieved so as to determine the phase patterns needed for pattern transfer.

The exemplary computer 36 further includes one or more storage devices such as a hard disk drive for reading from and writing to a hard disk, a magnetic disk drive for reading from or writing to a removable magnetic disk, and an optical disk drive for reading from or writing to a removable optical disk (such as a CD-ROM or other optical media).

Such storage devices can be connected to the system bus by a hard disk drive interface, a magnetic disk drive interface, and an optical drive interface, respectively. The drives and their associated computer-readable media provide non-volatile storage of computer-readable instructions, data structures, program modules, and other data for the PC 1100.

Other types of computer-readable media which can store data that is accessible by a PC, such as magnetic cassettes, flash memory cards, digital video disks, CDs, DVDs, RAMs, ROMs, and the like, may also be used in the exemplary operating environment.

A number of program modules may be stored in the storage devices including an operating system, one or more application programs, other program modules, and program data. A user may enter commands and information into the computer 36 through one or more input devices such as a keyboard and a pointing device such as a mouse. Other input devices may include a digital camera, microphone, joystick, game pad, satellite dish, scanner, or the like. These and other input devices are often connected to the one or more processing units through a serial port interface that is coupled to the system bus, but may be connected by other interfaces such as a parallel port, game port, or universal serial bus (USB). A monitor or other type of display device is also connected to the system bus via an interface, such as a video adapter. Other peripheral output devices, such as speakers and printers (not shown), may be included.

The computer 36 may operate in a networked environment using logical connections to one or more remote computers, such as a remote computer. In some examples, one or more network or communication connections are included. The remote computer may be another PC, a server, a router, a network PC, or a peer device or other common network node, and typically includes many or all of the elements described above relative to the PC. The computer 36 can be connected to a logical a local area network (LAN) and a wide area network (WAN). Such networking environments are commonplace in offices, enterprise-wide computer networks, intranets, and the Internet.

While the particular assembly as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A method for forming an actual workpiece pattern on a workpiece using a phase mask that includes a plurality of pixels, wherein each pixel has a first pixel dimension, the method comprising:

evaluating a desired workpiece pattern to identify a desired repetitive step cell in the desired workpiece pattern, the desired repetitive step cell having a first desired step cell dimension;

adjusting the desired repetitive step cell to create an adjusted repetitive step cell prior to exposing the workpiece, the adjusted repetitive step cell having a first adjusted step cell dimension that is equal to a first integer multiplied by the first pixel dimension, the first adjusted step cell dimension being different than the first desired step cell dimension; and controlling the phase mask to expose the workpiece based on the adjusted repetitive step cell to form the actual workpiece pattern on the workpiece.

2. The method of claim 1 wherein evaluating the desired workpiece pattern includes the desired repetitive step cell having a second desired step cell dimension that corresponds to a desired step cell length, and the first desired step cell dimension corresponds to a desired step cell width; and wherein adjusting the desired repetitive step cell includes the adjusted repetitive step cell having a second adjusted step cell second dimension that is equal to a second integer multiplied by a second pixel dimension of each pixel.

3. The method of claim 2 wherein the first integer is a multiple of two and the second integer is a multiple of two.

4. The method of claim 1 further comprising the step of using the adjusted repetitive step cell to create a mask stepping array within the phase mask.

5. The method of claim 1 further comprising the step of providing the phase mask, controlling a phase of each of the pixels with a control system including a processor, and directing a shaped illumination beam at the phase mask.

6. The method of claim 1 wherein the desired workpiece pattern includes a single repetitive pattern.

7. The method of claim 1 wherein the desired workpiece pattern includes at least two repetitive patterns positioned adjacent to each other.

8. A method for forming an actual workpiece pattern on a workpiece using a phase mask that includes a plurality of pixels, wherein each pixel has a first pixel dimension, the method comprising:

evaluating a desired workpiece pattern with a control system that includes a processor to identify a desired repetitive step cell in the desired workpiece pattern, the desired repetitive step cell having a first desired step cell dimension;

creating an adjusted repetitive step cell from the desired repetitive step cell with the control system prior to exposing the workpiece, the adjusted repetitive step cell having a first adjusted step cell dimension that is equal to a first integer multiplied by the first pixel dimension, the first adjusted step cell dimension being different than the first desired step cell dimension; and controlling the phase mask with the control system to expose the workpiece based on the adjusted repetitive step cell to form the actual workpiece pattern on the workpiece.

9. The method of claim 8 wherein the creating the adjusted repetitive step cell includes adjusting the desired repetitive step cell.

10. The method of claim 8 further comprising the step of using the adjusted repetitive step cell to create a mask stepping array with the control system for the phase mask.

11. The method of claim 8 further comprising the step of providing the phase mask, controlling a phase of each of the pixels with the control system, and directing a shaped illumination beam at the phase mask.

12. The method of claim 8 wherein the desired workpiece pattern includes a single repetitive pattern.

13. The method of claim 8 wherein the desired workpiece pattern includes at least two repetitive patterns positioned adjacent to each other.

14. The method of claim 8 wherein evaluating the desired workpiece pattern includes the desired repetitive step cell having a second desired step cell dimension that corresponds to a desired step cell length, and the first desired step cell dimension corresponds to a desired step cell width; and wherein creating the desired repetitive step cell includes the adjusted repetitive step cell having a second adjusted step cell second dimension that is equal to a second integer multiplied by a second pixel dimension of each pixel.

15. A device for transferring a circuit pattern to a workpiece, the circuit pattern including a plurality of regions that have a common region pattern, each of the plurality of regions having a first region dimension measured along a first direction and a second region dimension measured along a second direction that is different than the first direction, the device comprising:
 a spatial light modulator having a plurality of pixels, each of the plurality of pixels including a first pixel dimension and a second pixel dimension;
 an illumination system that directs radiation at the spatial light modulator;
 a projection optical system that directs the radiation at the workpiece to transfer the circuit pattern to the workpiece, the projection optical system having an adjustable optical adjustment factor that represents how the projection optical assembly influences a size of the circuit pattern transferred to the workpiece, wherein the optical adjustment factor is adjusted prior to the projection optical system directing the radiation at the workpiece until the first pixel dimension multiplied by the optical adjustment factor is a first integer multiple of the first region dimension, and
 a control system that controls the spatial light modulator and the illumination system such that the regions are transferred to the workpiece while the projection optical system is at the adjusted optical adjustment factor.

16. The device according to claim 15, wherein the optical adjustment factor is further adjusted until the second pixel dimension multiplied by the optical adjustment factor is a second integer multiple of the second region dimension.

17. The device according to claim 16, wherein the plurality of pixels of the spatial light modulator change a phase of the emitted radiation.

18. The device according to claim 16, wherein the plurality of regions are arranged as a two-dimensional array along the first direction and the second direction.

19. The device according to claim 16, wherein the plurality of regions are rectangular shaped.

20. The device according to claim 16, wherein the first integer is a multiple of two and the second integer is a multiple of two.

21. The device according to claim 15, wherein the plurality of regions are arranged along the first direction.

22. The device according to claim 21, wherein the plurality of regions are adjacent to each other.

23. The device according to claim 15, wherein the plurality of regions are adjacent to each other.

24. The device according to claim 15, wherein the first integer is a multiple of two.

25. An exposure method that transfers a circuit pattern to a workpiece by using a spatial light modulator having a plurality of pixels, each of the plurality of pixels including a first pixel dimension and a second pixel dimension, the method comprising:
 irradiating the spatial light modulator with radiation from an illumination system;
 allowing the radiation from the spatial light modulator to come into a projection optical system, the projection optical system having an adjustable optical adjustment factor that represents how the projection optical assembly influences a size of the circuit pattern transferred to the workpiece;
 exposing a plurality of regions of the circuit pattern on the workpiece by using radiation from the projection optical system, each of the plurality of regions having a first region dimension measured along a first direction and a second region dimension measured along a second direction that is different than the first direction; and
 controlling the spatial light modulator and the illumination system such that the regions are transferred to the workpiece,
 wherein the plurality of pixels of the spatial light modulator are not adjusted during the step of exposing the plurality of regions on the workpiece,
 wherein the plurality of regions have a common region pattern,
 wherein the optical adjustment factor is adjusted prior to the projection optical system exposing the plurality of regions on the workpiece until the first pixel dimension multiplied by the optical adjustment factor is a first integer multiple of the first region dimension, and
 wherein the spatial light modulator and the illumination system are controlled such that the regions are transferred to the workpiece while the projection optical system is at the adjusted optical adjustment factor.

26. The exposure method according to claim 25, wherein the plurality of pixels of the spatial light modulator change a phase of the emitted radiation.

27. The exposure method according to claim 25, wherein the optical adjustment factor is further adjusted until the second pixel dimension multiplied by the optical adjustment factor is a second integer multiple of the second region dimension.

28. The exposure method according to claim 27, wherein the exposing includes exposing the workpiece such that the plurality of regions are arranged as a two-dimensional array along the first direction and the second direction.

29. The exposure method according to claim 28, wherein each of the plurality of regions is rectangular shaped.

30. The exposure method according to claim 27, wherein the first integer is a multiple of two and the second integer is a multiple of two.

31. The exposure method according to claim 25, wherein the plurality of regions are arranged along the first direction.

32. The exposure method according to claim 25, wherein the first integer is a multiple of two.

33. The exposure method according to claim 25, further comprising preparing drive data of the plurality of pixels of the spatial light modulator.

34. The exposure method according to claim 33, wherein the preparing includes converting pattern data of an exposing pattern to the drive data.

35. The exposure method according to claim 34, wherein the converting includes:
 identifying a repetitive pattern region in the exposing pattern;
 evaluating the second region dimension, measured along the second direction, of the repetitive pattern region to determine if the second region dimension is equal to the first integer multiplied by (i) a second pixel dimension of the pixel along the second direction and (ii) the optical adjustment factor.

36. The exposure method according to claim 35, wherein the converting further includes:
adjusting the repetitive pattern region when the second region dimension of the repetitive pattern region along the second direction is not equal to the first integer multiplied by (i) the second pixel dimension of the pixel along the second direction and (ii) the optical adjustment factor.

37. The exposure method according to claim 35, further comprising:
adjusting the optical adjustment factor of the projection optical system when the second region dimension of the repetitive pattern region along the second direction is not equal to the first integer multiplied by (i) the second pixel dimension of the pixel along the second direction and (ii) the optical adjustment factor.

38. The exposure method according to claim 37, wherein the exposing comprises:
exposing the plurality of regions on the workpiece; and
exposing a region on the workpiece other than the plurality of regions.

39. The exposure method according to claim 38, wherein the adjusting includes adjusting the optical adjustment factor of the projection optical system between exposing the plurality of regions and exposing another region other than the plurality of regions.

40. A method for producing a device, comprising:
exposing a photosensitive substrate with a predetermined pattern by using the exposure method of claim 25;
developing the photosensitive substrate to which the predetermined pattern is transferred so that a mask layer, which has a shape corresponding to the predetermined pattern, is formed on a surface of the photosensitive substrate; and
processing the surface of the photosensitive substrate via the mask layer.

41. An exposure apparatus for transferring a circuit pattern to a workpiece, the exposure apparatus comprising:
a spatial light modulator including a plurality of pixels, each of the plurality of pixels including a first pixel dimension and a second pixel dimension;
an illumination system that directs radiation at the spatial light modulator;
a projection optical system that directs the radiation from the spatial light modulator along an optical axis, the projection optical system having an adjustable optical adjustment factor that represents how the projection optical assembly influences a size of the circuit pattern transferred to the workpiece;
a stage which holds the workpiece, the stage being movable in a plane crossing to the optical axis of the projection optical system; and
a controller which controls at least the spatial light modulator, the illumination system and the stage to expose a plurality of regions of the circuit pattern on the workpiece using radiation from the projection optical system, each of the plurality of regions having a first region dimension measured along a first direction and a second region dimension measured along a second direction that is different than the first direction,
wherein the plurality of regions have a common region pattern,
wherein the optical adjustment factor is adjusted prior to the projection optical system directing the radiation from the spatial light modulator along the optical axis until the first pixel dimension multiplied by the optical adjustment factor is a first integer multiple of the first region dimension, and
wherein the spatial light modulator and the illumination system are controlled such that the regions are transferred to the workpiece while the projection optical system is at the adjusted optical adjustment factor.

42. The exposure apparatus according to claim 41, wherein the optical adjustment factor is further adjusted until the second pixel dimension multiplied by the optical adjustment factor is a second integer multiple of the second region dimension.

43. The exposure apparatus according to claim 42, wherein the spatial light modulator changes a phase of a radiation from the plurality of pixels.

44. The exposure apparatus according to claim 43, wherein the controller controls the stage and the spatial light modulator such that the plurality of regions are arranged as a two-dimensional array along the first direction and the second direction.

45. The exposure apparatus according to claim 44, wherein each of the plurality of regions is rectangular shaped.

46. The exposure apparatus according to claim 42, wherein the first integer is a multiple of two and the second integer is a multiple of two.

47. The exposure apparatus according to claim 46, wherein the controller controls the spatial light modulator and the stage so that the plurality of regions are arranged along the first direction.

48. The exposure apparatus according to claim 41, wherein the plurality of regions are arranged along the first direction.

49. The exposure apparatus according to claim 41, wherein the first integer is a multiple of two.

50. The exposure apparatus according to claim 41, wherein the controller generates a drive data of the plurality of pixels of the spatial light modulator.

51. The exposure apparatus according to claim 50, wherein the controller converts a pattern data of an exposing pattern to the drive data.

52. The exposure apparatus according to claim 51, wherein the controller:
identifies a repetitive pattern region in the exposing pattern; and
evaluates the second region dimension, measured along the second direction, of the repetitive pattern region to determine if the second region dimension is equal to the first integer multiplied by (i) a second pixel dimension of the pixel along the second direction and (ii) the optical adjustment factor.

53. The exposure apparatus according to claim 52, wherein the controller:
adjusts the repetitive pattern region when the second region dimension of the repetitive pattern region along the second direction is not equal to the first integer multiplied by (i) the second pixel dimension of the pixel along the second direction and (ii) the optical adjustment factor.

54. The exposure apparatus according to claim 52, wherein the controller:
adjusts the optical adjustment factor of the projection optical system when the second region dimension of the repetitive pattern region along the second direction is not equal to the first integer multiplied by (i) the second pixel dimension of the pixel along the second direction and (ii) the optical adjustment factor.

55. The exposure apparatus according to claim 54, wherein the controller:
exposes the plurality of regions on the workpiece; and
exposes a region on the workpiece other than the plurality of regions.

56. A method for producing a device, comprising:
exposing a photosensitive substrate with a predetermined pattern by using the exposure apparatus of claim 41;
developing the photosensitive substrate to which the predetermined pattern is transferred so that a mask layer, which has a shape corresponding to the predetermined pattern, is formed on a surface of the photosensitive substrate; and
processing the surface of the photosensitive substrate via the mask layer.

57. An exposure method for exposing a plurality of pattern regions onto a workpiece, the method comprising:
illuminating a plurality of mirrors, each mirror having a first mirror dimension and a second mirror dimension; and
projecting radiation from the plurality of mirrors onto the workpiece via a projection optical system having an adjustable projection magnification that represents how the projection optical system influences a size of the pattern regions exposed onto the workpiece,
wherein each of the plurality of pattern regions has a first region dimension measured along a first direction and a second region dimension measured along a second direction that is different than the first direction,
wherein the projection magnification is adjusted prior to the projection optical system projecting radiation from the plurality of mirrors onto the workpiece until the first mirror dimension multiplied by the projection magnification is a first integer multiple of the first region dimension.

58. The exposure method of claim 57, wherein the plurality of pattern regions are adjacent to each other.

59. The exposure method of claim 58, wherein the plurality of pattern regions form a circuit pattern.

60. The exposure method of claim 59, wherein the circuit pattern includes a pattern of SRAM.

61. The exposure method of claim 57, wherein a pattern exposed onto the workpiece includes a circuit pattern, and wherein each of the plurality of pattern regions includes a common region pattern.

62. The exposure method of claim 57, wherein a pattern exposed onto the workpiece includes a circuit pattern, and wherein the circuit pattern includes a plurality of repetitive patterns.

63. The exposure method of claim 57, wherein the projection magnification is further adjusted until the second mirror dimension multiplied by the projection magnification is a second integer multiple of the second region dimension.

64. A computer program for instructing an exposure apparatus that transfers a circuit pattern to a workpiece, the exposure apparatus including (i) a spatial light modulator having a plurality of pixels, each of the plurality of pixels including a first pixel dimension and a second pixel dimension; (ii) an illumination system that directs radiation at the spatial light modulator; (iii) a projection optical system that directs the radiation from the spatial light modulator along an optical axis, the projection optical system having an adjustable optical adjustment factor that represents how the projection optical assembly influences a size of the circuit pattern transferred to the workpiece; (iv) a stage which holds the workpiece, the stage being movable in a plane crossing to the optical axis of the projection optical system; and (v) a controller which controls at least the spatial light modulator, the illumination system and the stage to expose a plurality of regions of the circuit pattern having a common region pattern on the workpiece using radiation from the projection optical system, each of the plurality of regions having a first region dimension measured along a first direction and a second region dimension measured along a second direction that is different than the first direction; wherein the computer program instructs the controller to adjust the optical adjustment factor prior to the projection optical system directing the radiation from the spatial light modulator along the optical axis until the first pixel dimension multiplied by the optical adjustment factor is a first integer multiple of the first region dimension; and wherein the computer program instructs the control system to control the spatial light modulator and the illumination system such that the regions are transferred to the workpiece while the projection optical system is at the adjusted optical adjustment factor.

65. The computer program of claim 64, wherein the optical adjustment factor is further adjusted until the second pixel dimension multiplied by the optical adjustment factor is a second integer multiple of the second region dimension.

66. The method of claim 65 wherein the first integer is a multiple of two and the second integer is a multiple of two.

* * * * *